(12) United States Patent
Haah et al.

(10) Patent No.: US 10,404,287 B2
(45) Date of Patent: Sep. 3, 2019

(54) MAGIC STATE DISTILLATION WITH LOW SPACE OVERHEAD AND ASYMPTOTIC INPUT COUNT

(71) Applicant: Microsoft Technology Licensing, LLC, Redmond, WA (US)

(72) Inventors: Jeongwan Haah, Redmond, WA (US); David Wecker, Redmond, WA (US); Matthew Hastings, Seattle, WA (US); David Poulin, Sherbrooke (CA)

(73) Assignee: Microsoft Technology Licensing, LLC, Redmond, WA (US)

( * ) Notice: Subject to any disclaimer, the term of this patent is extended or adjusted under 35 U.S.C. 154(b) by 4 days.

(21) Appl. No.: 15/627,190

(22) Filed: Jun. 19, 2017

(65) Prior Publication Data

US 2018/0269906 A1 Sep. 20, 2018

Related U.S. Application Data

(60) Provisional application No. 62/473,915, filed on Mar. 20, 2017.

(51) Int. Cl.
*H03M 13/00* (2006.01)
*H03M 13/29* (2006.01)
(Continued)

(52) U.S. Cl.
CPC ........ *H03M 13/2909* (2013.01); *G06N 10/00* (2019.01); *H03M 13/033* (2013.01);
(Continued)

(58) Field of Classification Search
CPC ............ H03M 13/2909; H03M 13/611; G06N 99/002
See application file for complete search history.

(56) References Cited

U.S. PATENT DOCUMENTS

| | | | |
|---|---|---|---|
| 9,018,971 B2 | 4/2015 | Eastin | |
| 2010/0251049 A1* | 9/2010 | Goto | B82Y 10/00 714/746 |

OTHER PUBLICATIONS

Watrous, John,University of Calgary, General Quantum Errors: CSS codes. Mar. 23, 2006. CPSC 519/619: Quantum Computation . pp. 1-7 (Year: 2006).*

(Continued)

*Primary Examiner* — Samir W Rizk
(74) *Attorney, Agent, or Firm* — Klarquist Sparkman, LLP

(57) ABSTRACT

Disclosed herein are example embodiments of protocols to distill magic states for T-gates. Particular examples have low space overhead and use an asymptotically optimal number of input magic states to achieve a given target error. The space overhead, defined as the ratio between the physical qubits to the number of output magic states, is asymptotically constant, while both the number of input magic states used per output state and the T-gate depth of the circuit scale linearly in the logarithm of the target error. Unlike other distillation protocols, examples of the disclosed protocol achieve this performance without concatenation and the input magic states are injected at various steps in the circuit rather than all at the start of the circuit. Embodiments of the protocol can be modified to distill magic states for other gates at the third level of the Clifford hierarchy, with the same asymptotic performance. Embodiments of the protocol rely on the construction of weakly self-dual Calderbank-Shor-Steane codes ("CSS codes") with many logical qubits and large distance, allowing one to implement control-Swaps on multiple qubits. This code is referred to herein as the "inner code". The control-Swaps are then used to measure properties of the magic state and detect errors, using another code that is referred to as the "outer code". Alternatively, one can use weakly-self dual CSS codes which implement controlled Hadamards for the inner code, reducing circuit depth. Several specific small examples of this protocol are disclosed herein.

24 Claims, 10 Drawing Sheets

(51) Int. Cl.
*G06N 10/00* (2019.01)
*H03M 13/03* (2006.01)
*H03M 13/13* (2006.01)

(52) U.S. Cl.
CPC ....... *H03M 13/13* (2013.01); *H03M 13/2906* (2013.01); *H03M 13/611* (2013.01)

(56) References Cited

OTHER PUBLICATIONS

Aleksander et al., "Universal transversal gates with color codes—a simplified approach," Journal of Physical Rev. A, vol. 91, pp. 1-13 (Mar. 2015).
Alon et al., *The Probabilistic Method*, Third Edition, Wiley-Interscience, pp. 1-373 (Aug. 2008).
Berlekamp et al., "Restrictions on Weight Distribution of Reed-Muller Codes," *Journal of Information and Control*, vol. 14, Issue 5, pp. 442-456 (May 1969).
Bombin et al., "Topological Quantum Distillation," *Physical Review Letters*, vol. 97, Issue 18, pp. 1-4 (Oct. 2006).
Bravyi et al., "Doubled Color Codes," arXiv:1509.03239v1, pp. 1-53 (Sep. 2015).
Bravyi et al., "Magic State Distillation with Low Overhead," Phys. Rev. A, 10 pp. (2012).
Bravyi et al., "Majorana Fermion Codes," *New Journal of Physics*, vol. 12, Issue 8, 23 pp. (Aug. 2010).
Bravyi et al., "Universal Quantum Computation with ideal Clifford gates and noisy ancillas," Phys. Rev. A, 15 pp. (2005).
Calderbank et al., "Good quantum error-correcting codes exist," *Physical Review A*, vol. 54, No. 2, pp. 1-24 (Sep. 1995).
Calderbank et al., "Quantum Error Correction and Orthogonal Geometry," *Physical Review Letter*, vol. 78, Issue 3, pp. 1-4 (Jan. 1997).
Campbell et al., "A unified framework for magic state distillation and multiqubit gate-synthesis with reduced resource cost," *Physical Review A*, vol. 95, Issue 2, pp. 1-23 (Feb. 2017).
Campbell et al., "An efficient magic state approach to small angle rotations," Quantum Science and Technology, 19 pp. (2016).
Cambell et al., "Magic State Distillation in All Prime Dimensions using Quantum Reed-Muller Codes," arXiv:1205.3104v2, 18 pp. (Jul. 2012).
Duclos-Cianci et al., "Reducing the quantum computing overhead with complex gate distillation," Phys. Rev. A, 9 pp. (2015).
Eastin, "Distilling one-qubit magic states into Toffoli states," *Physical Review A*, vol. 87, Issue 3, pp. 1-8 (Mar. 2013).
Gottesman, "A Class of Quantum Error-Correcting Codes Saturating the Quantum Hamming Bound," *Physical Review A*, vol. 54, Issue 3, pp. 1-22 (Sep. 1996).

Grassl et al., "Quantum BCH Codes," *Proc. Int'l Symp. on Theoretical Electrical Engineering*, pp. 207-212 (Oct. 1999).
Haah et al., "Magic State Distillation with Low Space Overhead and Optimal Asymptotic Input Count," arXiv:1703.07847, pp. 1-48 (Mar. 2017).
Haah, "Towers of Generalized Divisible Quantum Codes," arXiv:1709.08658v1, 24 pp. (Sep. 2017).
Hastings, "Small Majorana Fermion Codes," *Journal of Quantum Information & Computation*, vol. 17, Nos. 13&14, pp. 1-11 (Nov. 2017).
International Search Report and Written Opinion, International Application No. PCT/US2018/022277, 17 pages, dated Jun. 21, 2018.
International Search Report and Written Opinion dated Oct. 9, 2018, from International Patent Application No. PCT/US2018/039636, 15 pp.
Jones, "Composite Toffoli gate with two-round error detection," *Physical Review A*, vol. 87, Issue 5, pp. 1-8 (May 2013).
Jones et al., "Multilevel distillation of magic states for quantum computing," *Physical Review A*, vol. 87, Issue 4, pp. 1-10 (Apr. 2013).
Jones, "Novel constructions for the fault-tolerant Toffoli gate," *Physical Review A*, vol. 87, pp. 1-5 (2013).
Karzig et al., "Scalable designs for quasiparticle-poisoning-protected topological quantum computation with Majorana zero modes," *Physical Review B*, vol. 95, Issue 23, pp. 1-32 (Jun. 2017).
Knill, "Fault-Tolerant Postselected Quantum Computation: Schemes," arXiv:quant-ph/0402171v1, pp. 1-17 (Feb. 2004).
Knill, "Fault-Tolerant Postselected Quantum Computation: Threshold Analysis," arXiv:quant-ph/0404104v1, pp. 1-21 (Apr. 2004).
Kubica et al., "Universal tranversal gates with color codes—a simplified approach," *Physical Review A*, vol. 91, Issue 3, pp. 1-13 (Mar. 2015).
Landahl et al., "Complex instruction set computing architecutre for performing accurate quantum Z rotations with less magic," arXiv:1302.3240v2, 13 pp. (Oct. 2013).
Meier et al., "Magic-state distillation with the four-qubit code," *Journal of Quantum Information & Computation*, vol. 13, Issue 3-4, pp. 1-10 (Mar. 2013).
Moser et al., "A Constructive Proof of the General Lovasz Local Lemma," *ACM*, vol. 57, Issue 2, pp. 1-15 (Jan. 2010).
Sloane et al., "Weight Enumerator for Second-Order Reed-Muller Codes," *IEEE Trans. on Information Theory*, vol. 16, Issue 6, pp. 745-751 (Nov. 1970).
U.S. Appl. No. 15/627,190, filed Jun. 19, 2017, 140 pp.
Vijay et al., "Quantum Error Correction for Complex and Majorana Fermion Qubits," arXiv:1703.00459v1, pp. 1-11 (Mar. 2017).
Ward, "Weight Polarization and Divisibility," *Journal of Discrete Mathematics*, vol. 83, pp. 315-326 (Aug. 1990).
Yoder et al., "Universal Fault-Tolerant Gates on Nondegenerate Stabilizer Codes," arXiv:1603.03948v1, 19 pp. (Mar. 2016).

\* cited by examiner

1100 ↘

```
apply an inner code and couter code to distill
a plurality of the magic states in the quantum
computing device, and thereby possible error
in the magic states, the inner code
comprising Bose-Chaudhuri-Hocquenghem
("BCH") codes to implement operations on a
plurality of physical qubits or quidits in the
quantum computing device - 1110
```

FIG. 11

MAGIC STATE DISTILLATION WITH LOW SPACE OVERHEAD AND ASYMPTOTIC INPUT COUNT

CROSS REFERENCE TO RELATED APPLICATIONS

This application claims the benefit of U.S. Provisional Application No. 62/473,915 entitled "Magic State Distillation With Low Space Overhead and Asymptotic Input Count" and filed on Mar. 20, 2017, which is hereby incorporated herein in its entirety.

FIELD

This application relates generally to quantum computing. In particular, this application discloses example architectures for quantum circuits that perform magic state distillation protocols.

SUMMARY

Disclosed herein are example embodiments of protocols to distill magic states for T-gates. Particular examples have low space overhead and use an asymptotically optimal number of input magic states to achieve a given target error. The space overhead, defined as the ratio between the physical qubits to the number of output magic states, is asymptotically constant, while both the number of input magic states used per output state and the T-gate depth of the circuit scale linearly in the logarithm of the target error. Unlike other distillation protocols, examples of the disclosed protocol achieve this performance without concatenation and the input magic states are injected at various steps in the circuit rather than all at the start of the circuit. Embodiments of the protocol can be modified to distill magic states for other gates at the third level of the Clifford hierarchy, with the same asymptotic performance. Embodiments of the protocol rely on the construction of weakly self-dual Calderbank-Shor-Steane codes ("CSS codes") with many logical qubits and large distance, allowing one to implement control-Swaps on multiple qubits. This code is referred to herein as the "inner code". The control-Swaps are then used to measure properties of the magic state and detect errors, using another code that is referred to as the "outer code". Alternatively, one can use weakly-self dual CSS codes which implement controlled Hadamards for the inner code, reducing circuit depth. Several specific small examples of this protocol are disclosed herein.

BRIEF DESCRIPTION OF THE DRAWINGS

FIG. 11 is a flowchart of an example method for distilling magic states in a quantum computing device in accordance with embodiments of the disclosed technology.

DETAILED DESCRIPTION

I. General Considerations

Figure 1:
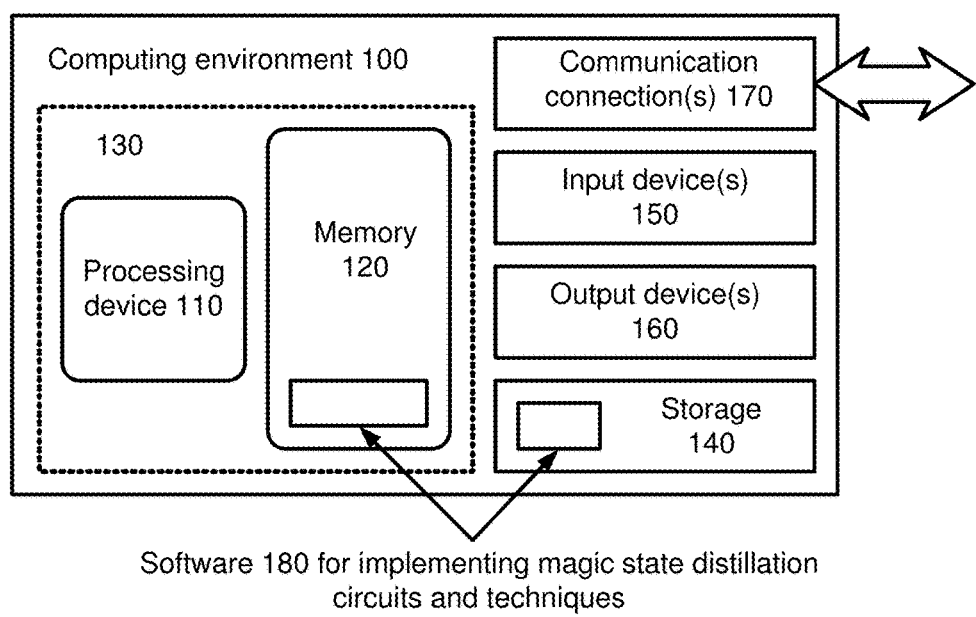
FIG. 1 shows an example embodiment of suitable computing environment for implementing several of the described embodiments.

Disclosed below are representative embodiments of methods, apparatus, and systems for magic state distillation in quantum computing devices, including quantum computing circuit architectures for performing such distillation.

Any of the disclosed example embodiments can be performed by a system comprising a classical processor and memory and/or at least in part by a quantum computing device (quantum computer) itself. The disclosed methods, apparatus, and systems should not be construed as limiting in any way. Instead, the present disclosure is directed toward all novel and nonobvious features and aspects of the various disclosed embodiments, alone or in various combinations and subcombinations with one another. Furthermore, any features or aspects of the disclosed embodiments can be used in various combinations and subcombinations with one another. For example, one or more method acts or features from one embodiment can be used with one or more method acts or features from another embodiment and vice versa. The disclosed methods, apparatus, and systems are not limited to any specific aspect or feature or combination thereof, nor do the disclosed embodiments require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Further, some of the methods described herein can be altered by changing the ordering of the method acts described, by splitting, repeating, or omitting certain method acts, etc. Moreover, for the sake of simplicity, the attached figures may not show the various ways in which the disclosed methods can be used in conjunction with other methods. Additionally, the description sometimes uses terms like evaluate, "determine", or "choose" to describe the disclosed technology. Such terms are high-level abstractions of the actual operations that are performed. The actual operations that correspond to these terms may vary depending on the particular implementation and are readily discernible by one of ordinary skill in the art.

As used in this application and in the claims, the singular forms a, an, and the include the plural forms unless the context clearly dictates otherwise. Additionally, the term includes means comprises. Further, as used herein, the term and/or means any one item or combination of any items in the phrase.

II. Introduction to Disclosed Technology

Large scale quantum computers rely on fault-tolerant architectures, in which errors are corrected faster than they are created. The standard approach is to use stabilizer codes to protect logical qubits from noise, and perform quantum gates at the encoded level. The overhead of the fault-tolerance is only polynomial in the logarithm of the desired accuracy, but in practice the overhead is estimated to be overwhelmingly large.

Particularly expensive operations are non-Clifford gates such as the π/4-rotation (T-gate) and Toffoli gate. A compelling approach is to inject a special state, called a magic state, into a Clifford-only circuit, and pass the cost of implementing the non-Clifford operation to the preparation of the magic states, which are distilled from noisy ones.

There exist several distillation protocols for the magic state for T gate using specialized quantum error correcting codes. See, e.g., E. Knill, "Fault-tolerant postselected quantum computation: Schemes," (2004), quant-ph/0402171v1; Sergei Bravyi and Alexei Kitaev, "Universal quantum computation with ideal Clifford gates and noisy ancillas." Phys. Rev. A 71, 022316 (2005), quant-ph/0403025; Adam M. Meier, Bryan Eastin, and Emanuel Knill. "Magic-state distillation with the four-qubit code," Quant. Inf. Comp. 13, 195 (2013), 1204.4221; Sergey Bravyi and Jeongwan Haah, "Magic state distillation with low overhead," Phys. Rev. A 86, 052329 (2012), 1209.2426. Each code can provide a fixed degree of fidelity improvement that is given by the code distance. In order to achieve arbitrary good fidelity, one typically concatenates small routines. In terms of the number of input magic states of low fidelity per one output magic state of high fidelity, some protocols are those in Sergey Bravyi and Jeongwan Haah, "Magic state distillation with low overhead," Phys. Rev. A 86, 052329 (2012), 1209.2426; and Cody Jones, "Multilevel distillation of magic states for quantum computing," Phys. Rev. A 87, 042305 (2013), 1210.3388v2. However, these protocols require a large batch of thousands of magic states to be useful.

In this disclosure, a family of distillation protocols is disclosed (e.g., an infinite family). Example embodiments of the disclosed protocol produce n T-magic states using at most cn qubits and achieve at least c'n-th order error suppression under the assumption that the sole noise source is the T gate, where c, c' are small universal constants. Since the degree of error suppression is high, there is no need to concatenate small routines, reducing the space overhead significantly.

Example embodiments of the disclosed protocol are also asymptotically superior (conjectured to be optimal) in terms of noisy T count. For any fixed odd d≥5, it is shown that the number of noisy T gate per one output magic state with error suppressed to d-th order converges to d exactly in the large code length limit.

Beyond the magic states for T gates, examples of the disclosed protocol can distill magic states for rotation by $\pi/2^k$ for k=3,4, . . . adapting the idea of Cuillaume Duclos-Cianci and David Poulin, "Reducing the quantum computing overhead with complex gate distillation," Phys. Rev. A 91, 042315 (2015), 1403.5280v1 and any gate in the third level of Clifford hierarchy (see Isaac L. Chuang and Daniel Gottesman, "Demonstrating the viability of universal quantum computation using teleportation and single-qubit operations," Nature 402, 390393 (1999)) For the latter, the asymptotic performance is similar to the T gate case.

Small instances of the disclosed family appear to outperform any other previous protocols. If noisy π/4 rotations can be directly done on qubits, an instance of the disclosed family operates on 34 qubits including measurement ancillas, produces 15 T-magic states with 5th order error suppression, and requires 29 noisy T gates per output.

Recent innovations show that the π/4-rotation and Toffoli gate can be implemented transversally on a class of error correcting codes. See Adam Paetznick and Ben W. Reichardt. "Universal fault-tolerant quantum computation with only transversal gates and error correction," Phys. Rev. Lett. 111, 090505 (2013), 1304.3709; Sergey Bravyi and Andrew Cross, "Doubled color codes," 1509.03239v1; Theodore J. Yoder, Ryuji Takagi. and Isaac L. Chuang, "Universal fault-tolerant gates on concatenated stabilizer codes," Physical Review X 6, 031039 (2016), 1603.03948. Transversal gates are inherently fault-tolerant, and hence this approach removes the need for magic states.

The organization of the remainder of the disclosure is as follows. In Section III, a basic explanation of the disclosed technology is given by exhibiting examples of small sizes. Section IV explains how to convert magic state distillation protocols for T gates into those for Toffoli gates. In section V, it is shown that any weakly self-dual CSS code can be used in distillation protocols by implementing measurement of Clifford operators. In section VI, asymptotic constructions of the codes are given, in the limit of either large distance or large code length. In section VII, results of numerical simulations are given; in this section, some specific additional small size protocols are disclosed that are not described elsewhere in the disclosure. Section IX provides some further discussion of the disclosed technology. In Section X, details are given, including stabilizer checks, for some of the specific codes used in this disclosure. Section XI gives circuits for some of the protocols used. Section XII describes unexpected relations among different, distillation protocols. Section XIII explains an extension to qudits using classification of symmetric forms over finite fields in Section XIV.

Throughout this disclosure, all classical codes that are considered will be linear codes over the binary field $\mathbb{F}_2$ and all quantum codes will be qubit stabilizer codes. Given a bit vector v, |v| is used to denote its Hamming weight. Our magic state is the $$(+1)\text{-}eigenstate \mid H\rangle = \cos\frac{\pi}{8}|0\rangle + \sin\frac{\pi}{8}|1\rangle$$

of the Hadamard operator H. The following matrices are used $$X = \begin{pmatrix} 0 & 1 \\ 1 & 0 \end{pmatrix}, \quad Y = \begin{pmatrix} 0 & -i \\ i & 0 \end{pmatrix}, \quad Z = \begin{pmatrix} 1 & 0 \\ 0 & -1 \end{pmatrix}. \tag{II.1}$$

$$H = \frac{1}{\sqrt{2}}\begin{pmatrix} 1 & 1 \\ 1 & -1 \end{pmatrix}, \quad T = e^{-i\pi Y/8} = \begin{pmatrix} \cos\frac{\pi}{8} & -\sin\frac{\pi}{8} \\ \sin\frac{\pi}{8} & \cos\frac{\pi}{8} \end{pmatrix}. \tag{II.2}$$

A self-orthogonal subspace of some vector space is a subspace such that the inner product of any two vectors in the subspace vanishes. A weakly self-dual CSS code is a quantum code whose stabilizer group is invariant under conjugation by the product of the Hadamard operator on all qubits; this is product is called a "transversal Hadamard".

III. Basic Distillation Protocols

Distillation protocols for magic states to date can be put roughly into two classes. Those in the first class implement a non-Clifford $\pi/4$-rotation to a stabilizer state such as $|+\rangle$ or $|0\rangle$. See Sergei Bravyi and Alexei Kitaev, "Universal quantum computation with ideal Clifford gates and noisy ancillas," Phys. Rev. A 71, 022316 (2005), quant-ph/0403025; Sergey Bravyi and Jeongwan Haah, "Magic state distillation with low overhead," Phys. Rev. A 86, 052329 (2012), 1209.2426; Andrew J. Landahl and Chris Cesare, "Complex instruction set computing architecture for performing accurate quantum Z rotations with less magic," (2013), 1302.3240. The non-Clifford rotation is desirably done fault-tolerantly, so the protocols in this class focus on finding error correcting codes that admits a transversal non-Clifford rotation. This requires the underlying code to have a special symmetry, which is rather rare. The protocols in the second class implement measurements of "stabilizers" of the magic state, based on the fact that a magic state in the third level of Clifford hierarchy is an eigenstate of a Clifford operator. See, e.g., E. Knill, "Fault-tolerant postselected quantum computation: Schemes," (2004), quant-ph/0402171v1; E. Knill. "Fault-tolerant postselected quantum computation: Threshold analysis," (2004), quantph/0404104v1; Adam M. Meier, Bryan Eastin, and Emanuel Knill, "Magic-state distillation with the four-qubit code," Quant. Inf. Comp. 13, 195 (2013), 1204.4221; Cody Jones, "Multilevel distillation of magic states for quantum computing," Phys. Rev. A 87, 042305 (2013), 1210.3388v2; Guillaume Duclos-Cianci and David Poulin, "Reducing the quantum computing overhead with complex gate distillation," Phys. Rev. A 91, 042315 (2015), 1403.5280v1; Earl T. Campbell and Joe O'Corman, "An efficient magic state approach to small angle rotations," Quantum Science and Technology 1, 015007 (2016), 1603.04230v2. To measure a Clifford operator, one can use a non-Clifford operation which has been implemented fault-tolerantly by a distance-two code.

The example schemes in this disclosure belong to the second class. There are two levels of error correcting codes in examples of the disclosed scheme, which are referred to as inner and outer codes.

Roughly speaking, the outer codes specify a certain set of measurements of Clifford operators on a set of input magic states, and the inner codes specify how to implement these measurements.

Aspects of the disclosed technology can be described by two examples. These examples are for illustration purposes only, as they involve a relatively small number of non-Clifford gates and states, but help illustrate certain principles of the disclosed technology. The disclosed technology is highly scalable and a more general class of protocols is presented in later sections.

Without loss of generality, by a standard Clifford twirling argument, one can assume that each $\pi/4$ rotation and undistilled magic state suffers from independent Y errors with probability $\epsilon$. This error model is referred to as the stochastic error model.

A. Trivial Outer Code

If one could implement the control-Hadamard, then the distillation is relatively straightforward: Prepare an ancilla qubit in $|+\rangle$ state, apply the control-Hadamard with the control on the ancilla and the Hadamard on an arbitrary target qubit, and measure the ancilla in X-basis to accept +1 outcome. The accepted target qubit is projected onto the magic state.

The control-Hadamard belongs to the third level of Clifford hierarchy, and thus cannot be implemented with Clifford operations. To obtain an approximate control-Hadamard with noisy non-Clifford rotations, one can use an error correcting code that can implement H on the logical qubits fault-tolerantly.

1. [[7,1,3]] Inner Code

To this end, observe that the Steane code admits a transversal Hadamard. See, e.g., A. M. Steane, "Error correcting codes in quantum theory," Physical Review Letters 77, 793797 (1996); E. Knill, "Fault-tolerant postselected quantum computation: Schemes," (2004), quant-ph/0402171v1. The stabilizers are $$IIIXXXX\ IIIZZZZ$$

$$IXXIIXX,\ IZZIIZZ,$$

$$XIXIXIX\ ZIZIZIZ \quad\quad (III.1)$$

the group generated by which is fixed under the $H^{\otimes 7}$: $X_i \leftrightarrow Z_i$, and the logical operator pair is $$ZZZZZZZ\ XXXXXXX \quad\quad (III.2)$$

which are interchanged by the transversal Hadanmard. Using an identity $$H = TZT^\dagger = e^{-i\pi Y/8} Z e^{i\pi Y/8} \quad\quad (III.3)$$

one can see that the logical control-Hadamard is possible by replacing the middle Z by the control-Z. The T gate can be noisy as they act on the physical qubits of the Steane code.

This way, a Hadamard measurement routine has been created that is fault-tolerant. Then, one example magic state distillation protocol is as follows:

1. Prepare a noisy magic state in the "data" register, and $|0\rangle$ in 6 check registers, and embed them into the Steane code
2. Prepare an ancilla in $|+\rangle$ and implement control-$H^{\otimes 7}$ using Eq. (III.3), where the control is the ancilla and the targets are the physical qubits of the Steane code.
3. Inverse the embedding of the Steane code.
4. Measure the ancilla in the X basis, the check qubits in the Z basis.
5. Upon +1 outcome in all 7 measurements, a distilled magic state is in the data qubit.

Now examine the pattern of errors that may go undetected. There are two possibilities.

The initial magic state is faulty, and this is undetected due to malfunction of the control-Hadamard.

The noisy $\pi/4$ rotations induce a logical error.

The first possibility is because a pair of simultaneous errors sandwiching the control-Z can alter the ancilla measurement:

$$|0\rangle\langle 0|\otimes I + |1\rangle\langle 1|\otimes e^{-i\pi Y/8} YZY e^{i\pi Y/8} = (Z\otimes I)(|0\rangle$$
$$\langle 0|\otimes I + |1\rangle\langle 1|\otimes e^{-i\pi/8} Z e^{i\pi Y/8}). \quad\quad (III.4)$$

Thus, the first possibility occurs with probability $\epsilon^3$ to leading order. One can easily see that this is the only possibility for weight 2 errors from the control-Hadamard to escape. The second possibility occurs at order $\epsilon^3$ since Steane's code has distance 3.

It is useful to think of the above protocol as a Hadamard measurement (H-measurement) routine that introduces a new error of order $\epsilon^3$ to the target, and another error of order $\epsilon^2$ to the control. The error on the control is easy to fix; repeat the measurement. This corresponds to having redundant checks in the outer code. The error on the target is inherent to the choice of the inner quantum code, and should thus be overcome by another quantum code.

2. [[17,1,5]] Inner Code

There exists a distance 5 code on 17 qubits with $H^{\otimes 17}$ being the logical Hadamard. It is an instance of the color code. H. Bombin and M. A. Martin-Delgado, "Topological quantum distillation," Physical Review Letters 97, 180501 (2006), quant-ph/0605138; Sergey Bravyi and Andrew Cross, "Doubled color codes," 1509.03239v1. The binary matrix for this code is included in Section X. In a similar way as above, this H-measurement routine has error rate $O(\epsilon^5)$ on the target, and $O(\epsilon^2)$ on the control. By repeating the H-measurement twice using this inner code, the control's error rate becomes $O(\epsilon^4)$. The control error goes undetected only if the initial magic state is faulty. Overall, only weight 5 errors may be undetected.

In fact, one can pipeline the two H-measurement routines: First, H-measure a noisy magic state using [[7,1,3]] code, and then H-measure the outcome using [[17,1,5]] code. (Interestingly, the protocol using Steane code, and the pipelined protocol appear to have deep relation with triply even codes. See Section XII.) Hence, a distillation routine has been obtained with fifth order error suppression that operates on 18 qubits in total. The circuit is in FIG. 7 in Section XI.

B. Repetition Outer Code

Imagine one has $n_{outer}$ noisy magic states that are to be distilled. Under the stochastic error model, one can think of the noisy magic states as an ensemble of $n_{outer}$-bit strings where 0 denotes a good magic state, and 1 denotes a bad one. The protocol in the previous subsection examines one qubit at a time, and in terms of the bit strings, this amounts to checking individual bits. If the goal is to suppress the overall error to d-th order where $d \le n_{outer}$, the bit-wise check might be unnecessary. A better way is to devise a measurement routine that can check the parity of several bits.

1. [[4,2,2]] Inner Code

The simplest case is when $n_{outer}=2$ and the desired error suppression is quadratic. If one can measure $H^{\otimes 2}$, then by postselecting on +1 outcome the noisy state is projected to the even parity subspace, which is $O(\epsilon^2)$ away from the pair of perfect magic states. One can describe the situation by saying that one has a repetition code on $n_{outer}=2$ bits with one parity check. This is an outer code.

A corresponding inner code should implement control-$H^{\otimes 2}$ to accuracy $O(\epsilon^2)$, both in the target and the control. Meier, Eastin, and Knill have designed such a measurement routine. See Adam M. Meier, Bryan Eastin, and Emanuel Knill, "Magic-state distillation with the four-qubit code," Quant. Inf. Comp. 13, 195 (2013), 1204.4221. The four qubit code [[4,2,2]] whose stabilizers are $X^{\otimes 4}$ and $Z^{\otimes 4}$ admits the transversal Hadamard $\bar{H}=H^{\otimes 4}$ as a logical operator. If one chooses the logical operators as $$\begin{cases} X & X & I & I \\ I & Z & Z & I \end{cases} \begin{cases} Z & Z & I & I \\ I & X & X & I \end{cases} \tag{III.5}$$

then the transversal Hadamard swaps the two logical qubits. Using Eq. (III.3), this means that one can implement control-Swap to accuracy $O(\epsilon^2)$. Now, in one example embodiment, the control-Swap is used twice sandwiching the Hadamard:

$$[{}^C\text{Swap}_{12}]H_1[{}^C\text{Swap}_{12}] = [{}^C(H_1 \otimes H_2)]H_1 \tag{III.6}$$

where the superscript C denotes the control that is common for both control-Swaps, and the subscripts 1 and 2 denote the qubits the operator acts on. The extra $H_1$ does no harm since the magic state is its eigenstate. The obtained control-$H^{\otimes 2}$ is accurate up to error $O(\epsilon^2)$ on the target since the distance of the four-qubit code is 2, and also $O(\epsilon^2)$ on the control due to Eq. (III.4). (Meier, Eastin, and Knill compresses the circuit for the control-$H^{\otimes 2}$. See Adam M. Meier, Bryan Eastin, and Emanuel Knill, "Magic-state distillation with the four-qubit code," Quant. Inf. Comp. 13, 195 (2013), 1204.4221; see also Earl T. Campbell and Joe O'Corman, "An efficient magic state approach to small angle rotations," Quantum Science and Technology 1, 015007 (2016), 1603.04230v2.) This is a quadratic distillation protocol.

2. [[16,6,4]] Inner Code and Pipelining

The classical Hadamard code [16,5,8] has a property that every code word has even overlap with any other code word. By the CSS construction, using these classical codewords as stabilizers, one obtains a [[16,6,4]] code; see section X A 2 for the stabilizers. It will later be shown that there is a choice of logical operators such that the transversal Hadamard $H^{\otimes 16}$ implements simultaneous pairwise swaps on the three pairs of logical qubits. This implies that one can measure any even product. $\tilde{H}^{\otimes 2}$, $\tilde{H}^{\otimes 4}$, or $\tilde{H}^{\otimes 6}$ of Hadamards on $k_{inner}=6$ magic states. For example, one can generalize Eq. (III.6) to $$[{}^C\text{Swap}_{12}][{}^C\text{Swap}_{34}]H_1H_3[{}^C\text{Swap}_{12}][{}^C\text{Swap}_{34}] = [C(H_1 \otimes H_2 \otimes H_3 \otimes H_4)]H_1H_3. \tag{III.7}$$

The classical Hadamard code [16,5,8] has a property that every code word has even overlap with any other code word. By the CSS construction, using these classical codewords as stabilizers, one obtains a [[16,6,4]] code; see section X A 2 for the stabilizers. The H-measurement routine puts quadratic error to the control and quartic error to the target.

Imagine that $n_{outer}=6$ magic states are laid on a ring. One can measure $H^{\otimes 2}$ on every nearest neighboring pair of the magic states. There are six checks in total. The measurement pattern follows the parity checks of the classical repetition code; there is a redundancy in the checks, which turns out to be necessary. Now consider how this achieves quartic error suppression. In order for an error on one of $n_{outer}$ magic states to pass the measurement routines, the two checks that involve that input state must both be faulty. This process gives an $O(\epsilon^5)$ error, e.g., the probability of both checks being faulty is $O(\epsilon^4)$, so including the error on the input magic state the error is $O(\epsilon^5)$. Note that if one did not have a redundancy in the checks of the outer code, using only 5 checks, one qubit would be checked only once and one would achieve only third order error suppression. More generally, any process involving one or more input magic state errors gives an error which is at most $O(\epsilon^5)$. The dominant error after all the H-measurements is then from the logical error by the H-measurement routine, which happens with probability $O(\epsilon^4)$.

One can pipeline the [[4,2,2]] code routine in front of the [[16,6,4]] code routine to lower the complexity of the distillation circuit. For instance, one can run the three H-measurement routines by the [[4,2,2]] code on pairs of magic states (12), (34), and (56), and then run the three H-measurement routines by [[16,6,4]] code on pairs of magic states (23), (45), and (61). It is straightforward to show that the modified version also achieves quartic error suppression. The modified version has been simulated, and the results can be found in Section VII. The circuit is in FIG. 6 in Section XI.

IV. Third Level of Clifford Hierarchy

The protocol above can be straightforwardly generalized to distilling other magic states to implement gates at, the third level of the Clifford hierarchy. Consider a state $|\psi\rangle$ on q qubits such that $|\psi\rangle = U|\phi\rangle$ where U is a gate at the third level of the Clifford hierarchy and $|\phi\rangle$ is a stabilizer state. See Isaac L. Chuang and Daniel Gottesman, "Demonstrating the viability of universal quantum computation using teleportation and single-qubit operations," Nature 402, 390393 (1999). An example of such a state $|\psi\rangle$ is the magic state to produce a CCZ gate, which is equivalent to the Toffoli gate up to a Hadamard on the target. See Peter W. Shor, "Fault-tolerant quantum computation," in Foundations of Computer Science, 1996.

$$|\psi\rangle = \underbrace{cc_Z}_{U}\underbrace{\left(\frac{|0\rangle+|1\rangle}{\sqrt{2}}\right)^{\otimes 3}}_{|\phi\rangle}. \quad (\text{IV.1})$$

As $|\psi\rangle$ is a stabilizer state, one can identify q operators, $S(1), S(2), \ldots, S(q)$, which are products of Paulis, generating the stabilizer group of $|\phi\rangle$ so that $|\phi\rangle$ is the unique (up to global phase)+1 eigenstate of those operators. For the CCZ, one can see $S(1)=X_1$, $S(2)=X_2$, and $S(3)=X_3$. Then, the state $|\psi\rangle$ is the unique +1 eigenstate of the operators $$W(a)=US(a)U^\dagger, \text{ for } a=1,\ldots,q. \quad (\text{IV.2})$$

These operators W(a) commute with each other by construction, and belong to the second level of the hierarchy, the Clifford group. For the CCZ, one can see $W(1)=X_1(^CZ)_{23}$, $W(2)=X_2(^CZ)_{13}$, and $W(3)=X_3(^CZ)_{12}$.

Here is an example protocol for CCZ state distillation using three copies of the [[4,2,2]] code.

In this example, the three copies are regarded as a single [[12,6,2]] code and the logical qubits are indexed by $1,\ldots,6$. One can encode one CCZ state stabilized by W(a) into logical qubits 1,3,5 and another stabilized by W'(a) into 2,4,6 where a=1,2,3. Consider a variant of Eq. (III.6)

$$[^C(\text{Swap}_{12}\text{Swap}_{34}\text{Swap}_{56})](W(a)_{135} \otimes I_{246})$$
$$[^C(\text{Swap}_{12}\text{Swap}_{34}\text{Swap}_{56})] = [^C(W(a)_{135} \otimes W(a)_{246})](W(a)_{135} \otimes I) \quad (\text{IV.3})$$

where the control qubit is common for every gate. The simultaneous control-Swaps are implemented by the control-$H^{\otimes 12}$ on the [[12,6,2]] code, where the control-$H^{\otimes 12}$ in turn is implemented by noisy T gates. Thus, one can obtain a measurement routine for $W(a) \otimes W'(a)$. (Since W(1), W(2), W(3) are the same up to permutations of qubits, the measurement routine can in fact measure any product $W(a) \otimes W'(b)$ for a, b=1, 2, 3 on the pair of CCZ states.)

Then the protocol is to measure W(1)W'(1), W(2)W'(2), and W(3)W'(3).

By applying the Clifford stabilizers W uniformly at random to a noisy magic state for CCZ, it becomes a mixture of eigenstates of W's. Hence one may assume an error model where an error flips at least, one of W(1), W(2), W(3) with probability $\epsilon$. Since the measurement routine puts measurement error at rate $O(\epsilon^2)$ and logical error at rate $O(\epsilon^2)$, the protocol achieves quadratic error reduction for CCZ state. For higher order reduction, one should use inner and outer code of higher distances.

A related discussion on error model for the T state is given in Section VII A.

In passing, it is noted that the Clifford unitary $V_{123} = (^{C_1}Z_2)(^{C_1}X_2)X_2X_3$ on three qubits 1, 2, 3 is a stabilizer of the CCZ state $$|CCZ\rangle = \frac{1}{\sqrt{8}} \sum_{a,b,c=0,1} (-1)^{abc} |abc\rangle.$$

Since the CCZ state is permutation invariant, one can obtain six such stabilizers. They do not commute, but any triple of them uniquely determines the CCZ state. The controlled version can be implemented with only four T gates. See Bryan Eastin, "Distilling one-qubit magic states into toffoli states," Phys. Rev. A 87, 032321 (2013), 1212.4872v2; see also Cody Jones, "Low-overhead constructions for the fault-tolerant toffoli gate," Physical Review A 87, 022328 (2013), 1212.5069. $^{C_0}V_{123}=T_2(^{C_1}Z_2)T_2(^{C_0}Z_2)T_2^\dagger(^{C_1}Z_2)T_2^\dagger(^{C_0}X_3)$. It might be possible to use these stabilizers with odd codes, but because they do not commute the resulting measurement routine rejects faulty inputs with a probability less than 1, even in the limit $\epsilon \to 0$.

V. Inner Codes

In this section, a general class of inner codes is disclosed that can be used in any of the distillation protocols disclosed herein.

A. Symmetric Forms Over $\mathbb{F}_2$

Consider finite dimensional vector spaces over the binary field $\mathbb{F}_2$. The space $\mathbb{F}_2^n$ is equipped with a symmetric dot product $v \cdot w = \Sigma_i v_i w_i \in \mathbb{F}_2$. This dot product on $\mathbb{F}_2$ is non-degenerate, e.g., for any nonzero vector $v \in \mathbb{F}_2^n$, there is a vector $w \in \mathbb{F}_2^n$ such that $v \cdot w = 1$. Let S be a null (self-orthogonal) subspace of $\mathbb{F}_2^n$, on which the dot product identically vanishes. Since S is null, the dot product of $\mathbb{F}_2^n$ canonically induces a dot product on the quotient space $\mathbb{F}_2^n/S$ by $[v] \cdot [w] := v \cdot w$ where [v] and [w] denote the equivalence classes (members of the quotient space) represented by v and w, respectively. Let $S^\perp$ denote the orthogonal complement of S with respect to the dot product.

Lemma 1. The induced dot product on $S^\perp/S$ is non-degenerate.

Proof. First, it is claimed that $(S^\perp)^\perp = S$. It is clear by definition that $S \subseteq (S^\perp)^\perp$. Interpreting the orthogonal complement as the solution space of a system of linear equations, one sees that the claim holds by dimension counting. For $[v] \in S^\perp/S$, if $[v] \cdot [w]=0$ for any w, then v belongs to $(S^\perp)^\perp = S$, implying that $[v]=0 \in S^\perp/S$. □

For any basis $\{[v^{(1)}], \ldots, [v^{(k)}]\}$ of $S^\perp/S$, consider the symmetric matrix $\Lambda$ representing the dot product:

$$\Lambda^{ab} = v^{(a)} \cdot v^{(b)}. \quad (\text{V.1})$$

Lemma 1 is equivalent to saying that the matrix $\Lambda$ is non-singular. Any basis change of $S^\perp/S$ induces a congruent transformation $\Lambda \to M^T \Lambda M$. One considers equivalence classes of $\Lambda$ under the congruent transformations.

Lemma 2 (Classification of symmetric forms over $\mathbb{F}_2$). A non-degenerate symmetric form over $\mathbb{F}_2$ is equivalent to one of the two non-equivalent choices:

$$I_n = \begin{pmatrix} 1 & & \\ & \ddots & \\ & & 1 \end{pmatrix}, \quad \lambda = I_{n/2} \otimes \begin{pmatrix} 0 & 1 \\ 1 & 0 \end{pmatrix}. \tag{V.2}$$

Proof. The two options are not equivalent since $\lambda_n$ means that the every vector is self-orthogonal, whereas $I_n$ implies that not every vector is self-orthogonal. For completeness, an elementary algorithmic proof is given by manipulating symmetric matrices.

First, it is claimed that any symmetric matrix can be brought to a direct sum of $I_p$ and $\lambda_q$ for some $p \geq 0$ and $q \geq 0$, where q is even. If there is a nonzero diagonal element one can bring this to the top-left by permutation. Gaussian elimination on the first column and row reveals that $I_1$ is a direct summand. Induction gives a direct summand $I_p$, and one is left with a symmetric matrix $\Lambda'$ with the zero diagonal. Any column cannot be zero since $\Lambda'$ is non-singular, and thus some permutation brings 1 to (2, 1) and (1, 2) entries of $\Lambda'$. Gaussian elimination on the first and second columns and rows reveals a direct summand $\lambda_2$. By induction, the first claim is proved.

The second claim is that $I_{p+2} \oplus \lambda_{q-2} \cong I_p \oplus \lambda_q$ whenever p, q>0, whose proof is immediate:

$$\begin{pmatrix} 1 & 1 & 1 \\ 1 & 1 & 0 \\ 1 & 0 & 1 \end{pmatrix} \begin{pmatrix} 1 & & \\ & 1 & \\ & & 1 \end{pmatrix} \begin{pmatrix} 1 & 1 & 1 \\ 1 & 1 & 0 \\ 1 & 0 & 1 \end{pmatrix} = \begin{pmatrix} 1 & 0 & 0 \\ 0 & 0 & 1 \\ 0 & 1 & 0 \end{pmatrix} \tag{V.3}$$

Therefore, whenever p>0, one has $I_p$, $\lambda_q \cong I_{p+q}$. If p=0, there is nothing more to prove. □

The classification motivates the following notion of bases.
Definition 1. Given a null subspace $S \subseteq \mathbb{F}_2^n$, a basis of $S^\perp/S$ is called (p,q)-magic if the symmetric matrix $\Lambda$ representing the dot product on $S^\perp/S$ among the basis vectors is equal to $I_p \oplus \lambda_q$ for some $p \geq 0$ and $q \geq 0$. A magic basis odd exists if p>0, or even if p=0.

One can summarize the results of this section into a theorem.
Theorem 1. For any self-orthogonal subspace $S \subseteq \mathbb{F}_2^n$, there exists a (p,q)-magic basis for $S^\perp/S$, where $p+q = \dim_{\mathbb{F}_2} S^\perp/S$. If p>0 and q>0, then a (p+2, q−2)-magic basis exists.

B. CSS Codes from Self-orthogonal Matrices

It is standard to associate a bit string $v=(v_1, \ldots, v_n)$ to a Pauli operator: $X(v) = X_1^{v_1} \ldots X_n^{v_n}$ where $X_j$ is the Pauli $\sigma^x$ on qubit j, and $Z(v) = Z_1^{v_1} \ldots Z_n^{v_n}$ where $Z_j$ is the Pauli $\sigma^z$ on qubit j. The commutation relation is that $$X(v)Z(w) = (-1)^{v \cdot w} Z(w)X(v). \tag{V.4}$$

The CSS construction of quantum codes applies to a self-orthogonal (null) subspace $S \subseteq \mathbb{F}_2^n$: For every vector $v \in S$, one can define an X-stabilizer $X(v)$ as well as Z-stabilizer $Z(v)$. The set of equivalence classes of X-type (Z-type) logical operators is then in one-to-one correspondence with $S^\perp/S$. The number of logical qubits is thus $$k = \dim \dim_{\mathbb{F}_2} S^\perp/S = n - 2 \dim_{\mathbb{F}_2} S. \tag{V.5}$$

One can encode logical qubits by choosing a complete set of logical operators $\tilde{X}^{(j)}$ and $\tilde{Z}^{(j)}$ as follows. Choose a (p,q)-magic basis $\{v^{(1)}, \ldots, v^{(p)}, w^{(1)}, \ldots, w^{(q)}\}$ of $S^\perp/S$. (Here an adapted notation is used to denote an equivalence class (a member of the quotient space) by a representative.) Then, one defines $$\begin{cases} \tilde{X}^{(i)} = X(v^{(i)}) \\ \tilde{Z}^{(i)} = Z(v^{(i)}) \end{cases} \text{for } i = 1, \ldots, p, \tag{V.6}$$

$$\begin{cases} \tilde{X}^{(p+2j-1)} = X(w^{(2j-1)}) \\ \tilde{Z}^{(p+2j-1)} = Z(w^{(2j)}) \end{cases} \begin{cases} \tilde{X}^{(p+2j)} = Z(w^{(2j-1)}) \\ \tilde{Z}^{(p+2j)} = X(w^{(2j)}) \end{cases} \text{for } j = 1, \ldots, q/2.$$

By definition of the magic basis, these logical operators obey the canonical commutation relation of Pauli operators on k qubits:

$$\tilde{X}^{(a)} \tilde{Z}^{(b)} (-1)^{\delta_{ab}} \tilde{Z}^{(b)} \tilde{X}^{(a)}. \tag{V.7}$$

Note that the commutation relation can be realized with arbitrary signs±in the choice of the logical operators, but induced Clifford logical operators will depend on the signs. (V.6) is enforced in order for the transversal Hadamard $\bar{H} = H^{n_{inner}}$ to be the logical Hadamard $$\prod_{a=1}^{k_{inner}} \tilde{H}^{(a)}.$$

CSS codes are defined based on self-orthogonal subspaces over $\mathbb{F}_2$:
Theorem 2. Let $S \subseteq \mathbb{F}_2^n$ be a self-orthogonal subspace with a (p,q)-magic basis of $S^\perp/S$. Then, there exists a CSS code on n qubits with p+q logical qubits and a choice of logical operators such that transversal Hadamard $H^{\otimes n}$ implements the logical Hadamard for the logical qubits $1, \ldots, p$, and simultaneously the swaps between the logical qubit $p+2j-1$ and $p+2j$ where $j=1, \ldots, q/2$.

In this disclosure, a weakly self-dual CSS code is called "odd" if the magic basis is odd, and even otherwise. It is possible for an odd code to have an even number of logical qubits, an even number of physical qubits, and an even distance. Every even code, however, has an even number of logical qubits, an even number of physical qubits, and an even distance.

It is noted that, the CSS codes derived from a self-orthogonal matrices are not too restrictive. By representing each qubit in any stabilizer code of parameters [[n,k,d]] by Majorana modes, one can obtain a weakly self-dual CSS code of parameters [[4n,2k,2d]]. See Sergey Bravyi, Bernhard Leemhuis, and Barbara M. Terhal, "Majorana fermion codes," New J. Phys. 12, 083039 (2010), 1004.3791. This mapping is briefly reviewed in Section VI B. Other families of such codes with improved rate are also presented.

VI. Coding Theory and Asymptotic Performance

A. Asymptotic Performance

In this section, the asymptotic properties of the class of protocols defined above are considered, for appropriate choice and inner and outer codes. Here, possibilities of pipelining are ignored, and only a single inner and outer code to define each protocol are used; this will reduce the question of asymptotic properties to the question of the existence of code families with certain properties.

In this discussion, "asymptotic" will refer to one of two limits. In the first limit, consider a family of protocols parametrized by d, the order of reduction in error. An instance in the family reduces error probability from $\epsilon$ to a constant times $\epsilon^d$ in the limit of small $\epsilon$. It can be proven that Theorem 3. There is a family of protocols parametrized by an integer d≥1 to obtain a d-th order reduction in error, using a total of $\Theta(d)$ physical qubits, producing $n_{outer}=\Theta(d)$ magic states. The total number of T gates used is $n_T=\Theta(d^2)$, so that the number of T gates per magic state is $\Theta(d)$. The T-gate depth of the circuit is also $\Theta(d)$, where the T-gate depth refers to the circuit depth assuming that an arbitrary Clifford can be executed in depth 1.

In the second limit, one can fix d and consider a family of protocols parametrized by $n_{outer}$, the number of magic states produced. Here it is proven that Theorem 4. For any odd d≥5, there is a family of protocols using $n_{outer}\cdot(1+o(1))$ physical qubits, producing $n_{outer}$ magic states with a d-th order reduction in error. The total number of T gates used is $$n_T = (1+o(1))n_{outer}. \quad\text{(VI.1)}$$

Given one particular protocol with $\epsilon_{out}=C\epsilon_{in}^d$ consuming $n_T/n_{outer}$ T gates per output, an infinite family of protocols can be defined by concatenation with itself. For this concatenated family, the number of T gates to achieve an arbitrarily small error rate δ in output magic states scales like $O((\log 1/\delta)^\gamma)$ where the scaling exponent is $$\gamma = \log_d(n_T/n_{outer}). \quad\text{(VI.2)}$$

See Sergei Bravyi and Alexei Kitaev, "Universal quantum computation with ideal Clifford gates and noisy ancillas," Phys. Rev. A 71, 022316 (2005), quant-ph/0403025; Sergey Bravyi and Jeongwan Haah, "Magic state distillation with low overhead," Phys. Rev. A 86, 052329 (2012), 1209.2426.

Smaller values of γ reflect asymptotically more efficient distillation protocols. The triorthogonal codes (see Sergey Bravyi and Jeongwan Haah, "Magic state distillation with low overhead," Phys. Rev. A 86, 052329 (2012), 1209.2426) achieve $\gamma\to\log_2(3)$, and "multilevel" protocol (see Cody Jones, "Multilevel distillation of magic states for quantum computing," Phys. Rev. A 87, 042305 (2013), 1210.3388v2) achieves $\gamma\to 1^+$. It was conjectured that no protocol could achieve γ<1. Both families in Theorems 3 and 4 achieve $\gamma\to 1^+$.

It can be noted that the measure γ slightly underestimates the T-count efficiency of the family in Theorem 3. In order to achieve an arbitrary small final error rate δ from a fixed initial error rate, say, $\epsilon=0.01$, one can pick a member $P_d$ of the family of error reduction degree d such that $\delta > C_d(\epsilon/2d^2)^d$. Here $C_d$ is the leading coefficient of the output error probability of the protocol $P_d$, which is at most the number of ways that weight d errors occur among $n_T=O(d^2)$ T gates; $C_d \le \alpha(d^{2d})$ for some α>0 independent of d. For the condition $\delta > C_d(\epsilon/d^2)^d$, it suffices that $d > (\log(1/\delta)+\log \alpha)/\log(1/\epsilon)$. One can initially distill magic states to suppress the error rate from $\epsilon$ to $\epsilon'=\epsilon/d^2$, by using a concatenated protocol $P_{init}$. This takes $n_{init}=O(\log d)^\gamma$ input magic states per output magic states for some γ>1. One can then feed $P_d$ with the outputs from $P_{init}$ at error rate $\epsilon'$. It follows that $$n_T/n_{outer} = O(d)\cdot n_{init} = O(\log(1/\delta)(\log\log 1/\delta)^\gamma) \quad\text{(VI.3)}$$

magic states at error rate e suffice to achieve final accuracy δ. Thus, the scaling of $n_T/n_{outer}$ is linear in $\log(1/\delta)$ up to a logarithmic correction. (One can iterate the argument recursively to further slow down the dependency on 1/δ.)

Theorem 4 will use odd codes. The reduced number of T gates required to implement checks with an odd code is essential to obtaining the number of T gates in the theorem (one would need roughly twice as many using even codes). This explains why d is chosen odd. The case of d=1 is of course trivial: no codes are needed.

Theorems 3, 4 will follow almost immediately given certain families of inner and outer codes obeying certain properties of the codes that are defined below. These theorems are proven given these properties in this subsection and families of inner and outer codes are constructed with these properties in subsections VI B and VI C.

Consider first, the inner code. This code will have $k_{inner}$ logical qubits and $n_{inner}$ physical qubits. The distance of the inner code will be at least d. Consider then the effect of errors in the T gates inside the inner code; e.g., in the T gates acting on the encoded state. To obtain d-th order reduction in error, it suffices to consider the case that fewer than d errors occur in such T gates. Since the inner code distance is at least d, these errors cannot produce a logical error. There is one way, however, in which these errors can have an effect without being detected by the inner code. It is possible that a pair of errors act inside the inner code, both on T gates acting on the same qubit. The effect of these errors is to cause an error in the check being measured by the inner code, e.g., if the check was measuring a given product of W operators specified by the outer code, one can instead measure the opposite sign; referred to herein as "measurement error".

The possibility of measurement errors affects some of the properties that are attributes of the outer code. Desirably, the outer code has a distance of at least d, as otherwise a pattern of fewer than d errors in the input magic states could cause an undetectable error, but this is not sufficient. It is desirable that a pattern of fewer than d errors causes enough checks to be violated so that even a small number of measurement errors will lead to an error detected by the code. This is defined by the property of "sensitivity" that is now defined.

The outer code will have m parity checks, encoded in an m-by-$n_{outer}$ parity check matrix M, where each row of the matrix indicates a given check. One can measure rows of this matrix with even weight using an even inner code and rows with odd weight using an odd inner code. For simplicity, and without limitation, all rows can have even weight or all rows can use use odd weight so that one can use the same inner code for all checks. (More generally, one could use both an inner and an outer code). Then, this inner code must have $k_{inner}$ greater than or equal to the maximum row weight of M. In this case, one can say that the inner code can implement the checks of the outer code.

Definition 2. An m-by-$n_{outer}$ parity check matrix M for a classical linear code is said to be ($\tilde{d}$,s)-sensitive if any nonzero bit vector v of length $n_{outer}$ with $|v| \le \tilde{d}$. It follows that $|Mv| \ge s$. That is, for any such vector, the number of violated parity checks is at least s.

It can be emphasized that sensitivity is a property of the check matrix of the outer code, rather than the codewords of the outer code, and in some examples the rows of the check matrix may be linearly dependent.

A ($\tilde{d}$,s)-sensitive parity check matrix is ($\tilde{d}-1$,s)-sensitive by definition.

Lemma 3. Given a parity check matrix M such that $2|Mv|+|v| \ge d$ for any nonzero v $$\left(\text{e.g.}\left(d-1, \frac{d-1}{2}\right) - \text{sensitive } M\right),$$

and given an inner code of distance d that can implement the checks defined by M, the protocol yields d-th order reduction in error.

Proof. Any error pattern inside the inner codes with weight less than d cannot cause a logical error. Thus, if an error pattern inside the inner code does not violate a stabilizer of the inner code, it either has no effect or it leads to an error in measurement of a check of the outer code; the latter possibility requires at least two errors inside the inner code. Any input state with $|v| \geq 1$ errors will violate at least $|Mv| \geq (d-|v|)/2$ checks of the outer code. If no violation of these checks is detected, there must be at least $2|Mv|$ errors on T gates inside the inner code. Thus, there must be at least d errors in total. □

Now, some asymptotic properties of the codes are defined.
Definition 3. A family of quantum error correcting codes with increasing number of qubits n has good rate if the number of encoded qubits k is $\Theta(n)$ and has good distance if the distance d is $\Theta(n)$.
Definition 4. Given a family of outer codes with increasing $n_{outer}$, one can say that this family has good sensitivity if each code in the family is $(\tilde{d},s)$-sensitive for $\tilde{d}=\Theta(n_{outer})$ and $s=\Theta(n_{outer})$.
Definition 5. Given a family of outer codes with increasing $n_{outer}$, one can say that this family has good check rate if the parity check matrix is m-by-$n_{outer}$ with $m=\Theta(n_{outer})$.
Proof of Theorem 3. In subsection VI B, it is shown that families of both even and odd inner codes with good rate and distance exist, and in subsection VI C, it shown that families of outer codes with good check rate, good sensitivity, and even row weight exist. Combining these results with Lemma 3, theorem 3 follows. □

Proof of Theorem 4. In subsection VI B, it is shown that, for any d, there exist families of both even and odd inner codes with increasing $n_{inner}$ such that $k_{inner}/n_{inner} \to 1$. To prove this theorem, one will only need the result for odd inner codes. Consider some code from this family with given $k_{inner}, n_{inner}$. In subsection VI C, Lemma 9 is shown, which is reproduced here:
Lemma. Given integers $\tilde{d}$, $w \geq 1$ and $s \geq 2$, there exists an $m \times n_{outer}$ parity check matrix M that is $(\tilde{d},s)$-sensitive where in $=n_{outer} \cdot s/w$ and every row of M has weight wt exactly.

Choose $w=k_{inner}$. Choosing $\tilde{d} \geq d-1$ and $s=(d-1)/2$, this gives an outer code such that the checks can be performed by the given inner code and one can perform $n_{outer}(S/W)= n_{outer}(s/k_{inner})$ checks with the inner code. Each such check with the inner code requires using $2n_{inner}$ T gates, so that the total number of T gates needed to perform the checks with the inner code is equal to $2n_{outer}s(n_{inner}/k_{inner})$. Additionally, one can perform $n_{outer}$ T gates to create the input magic states to the outer code. Thus, the total number of T gates is $$n_T = n_{outer}(1 + 2sn_{inner}/k_{inner}) \qquad (VI.4)$$
$$= n_{outer}(d + (d-1)(n_{inner}/k_{inner} - 1)).$$

Taking $n_{inner}$ large so $n_{inner}/k_{inner} \to 1$, it can be concluded that $n_T \to n_{outer} d$. □

One can now see better why $d \geq 5$ was used in Theorem 4. This is because for $d=3$, one has $s=1$ and lemma 9 does not apply. It will be explained later why the case $s=1$ is excluded from that lemma; roughly, this is because in this case, each bit participates in only a single check and one would lack certain expansion properties for a certain graph defined later.

B. Inner Codes

In this subsection, asymptotic constructions of inner codes are disclosed. Also in this subsection, a few constructions of weakly self-dual codes with good rate and distance are discussed as well as improvements to these schemes offered by the disclosed technology.

First, A. R. Calderbank and Peter W. Shor, "Good quantum error-correcting codes exist," Phys. Rev. A 54, 10981105 (1996), quant-ph/9512032 shows that, given any ratio d/n, one can find a family of weakly self-dual CSS codes with n qubits and distance d and given ratio d/n achieving a rate $k/n \to 1-2H_2(d/n)$, where $H_2$ is the binary entropy function. The codes found in that paper all are even codes. However, the disclosed technology can obtain odd codes from them by a "puncturing procedure" (see also section 3.5 of Daniel Gottesman, "Stabilizer codes and quantum error correction," (1997), quant-ph/9705052:
Definition 6. Given an even weakly-self-dual CSS code C on n qubits with k logical qubits, define a "punctured code" C' as follows. Choose a qubit i (the code C' may depend upon the choice of i). Write the stabilizer generators of C such that only one X-type and one Z-type generator is supported on i. Define C' by removing qubit i and removing the stabilizer generators support on i. Then C' has $n'=n-1$ qubits and $k+1$ logical qubits. The code C' is an odd code by construction.

If C is non-degenerate with distance d, then C' has distance $d' \geq d-1$. More generally, $d'+1$ is greater than or equal to the minimum weight of an operator which commutes with the stabilizer group of C, because given an X-type logical operator O in C' then either O or $OX_i$ must commute with the stabilizer group of C. Indeed, one may show that puncturing the codes of A. R. Calderbank and Peter W. Shor, "Good quantum error-correcting codes exist," Phys. Rev. A 54, 10981105 (1996), quant-ph/9512032 reduces the distance by at most 1.

The only disadvantage of this proof is that it is a greedy proof that is not known how to implement efficiently. One example of doing this is a randomized construction which allows one to give codes which, with high probability, have the desired distance. Unfortunately, this construction will only achieve $k/n \to \frac{1}{2} - H_2(2d/n)$. This construction uses a general method to construct weakly self-dual CSS codes in Sergey Bravyi, Bernhard Leemhuis, and Barbara M. Terhal, "Majorana fermion codes," New J. Phys. 12, 083039 (2010), 1004.3791.

Consider a stabilizer code $C_{qubit}$ which acts on n physical qubits and has k logical qubits and distance d. From this code, one can derive a code for Majorana fermions $C_{Majorana}$ which acts on 4n Majorana modes and has k logical qubits and distance 2d, where now the distance refers to minimum weight of a product of Majorana operators that is a logical operator. The code $C_{Majorana}$ is derived in the following way: For each physical qubit of $C_{qubit}$, one introduces four Majorana modes, $\gamma_0, \gamma_1, \gamma_2, \gamma_3$, and declares that the product $\delta_0\gamma_1\delta_2\gamma_3$ is a stabilizer of $C_{Majorana}$. For each stabilizer of $C_{qubit}$, one defines a stabilizer of $C_{Majorana}$ by replacing X on a qubit by $i\gamma_0\gamma_1$, Y by $i\gamma_0\gamma_2$, and Z by $i\gamma_0\gamma_3$. The stabilizer generators of $C_{Majorana}$ are given by bit strings of length 4n such that the dot product over $\mathbb{F}_2$ of any pair of such bit strings is 0. Thus, from $C_{Majorana}$, one can define a weakly self-dual CSS code $C_{wsd}$ with 4n physical qubits, 2k logical qubits and distance 2d. Since a randomized construction (see, for example, Eq. 7.200 of John Preskill, "Lecture notes on quantum computation." Caltech Ph219.) gives stabilizer codes $C_{qubit}$ with $k/n \to 1-H_2(d/n)-(d/n) \log_2(3)$, mapping these stabilizer codes $C_{qubit}$ to weakly-self dual codes $C_{wsd}$ gives $k/n \to (\frac{1}{2})[1-H_2(2d/n)-(2d/n) \log 2(3)]$. Since the randomized construction gives a lower bound to the weight of any operator commuting with the stabilizer group, one can puncture these codes and reduce the distance by at most 1.

Another proof of the existence of such good weakly self dual-codes is given below. This next proof will lead to rate $k/n \rightarrow 1-2H_2(d/n)$. For any fixed distance d, one can obtain families of stabilizer codes with n physical qubits and k logical qubits with the ratio $k/n \rightarrow 1$ as $n \rightarrow \infty$. While this improvement is only by constant factors over the construction via Majorana codes, it will lead to nice asymptotic expressions for the number of T-gates, $n_T$, required to attain d-th order suppression in error. It is also a randomized construction, showing that codes in a certain ensemble have the desired properties with high probability.

Define a random ensemble of n-by-c weakly self-orthogonal matrices as follows, where a matrix M is defined to be self-orthogonal if $MM^T=0$. Choose the first row of the matrix to be the all 1s vector $\vec{1}$. Choose the second row uniformly at random subject to the constraint that it have vanishing dot product with the first row. Continue in this fashion, choosing the j-th row uniformly at random subject to the constraint that it have vanishing dot product with the first j−1 rows. (Remark: the restriction that, the first row be the all 1s vector is simply chosen to simplify some notation, so that one does not need to add the requirement that each row have even weight.)

Lemma 4. Consider a fixed n-component vector v, with $v \neq 0$ and $v \neq \vec{1}$. For a random c-by-n self-orthogonal M, the probability that $Mv=0$ is at most $2^{-c+1}+2^{-n+c+1}$.

Proof. Let $w_1, \ldots, w_c$ be the rows of M. Let $V_j$ be the self-orthogonal subspace which is the span of the first j rows of M. One can estimate the desired probability by a union bound, considering separately the event that $v \in V_c^\perp$ and $v \notin V_c$, and the event that $v \in V_c^\perp$ and $v \in V_c$.

Consider the first event. Let $j>1$. Then $$Pr[w_j \cdot v = 0 | v \notin V_{j-1}] = 1/2, \quad (VI.5)$$

because the constraint that $(v, w_j)=0$ is independent of the constraints on the vector $w_j$. Thus, for any k, $$Pr[v \in V_k^\perp \text{ and } v \notin V_k] \leq \prod_{j=2}^{k} \frac{1}{2} = 2^{-k+1}. \quad (VI.6)$$

For k=c, one can find in particular that $$Pr[v \in V_c^\perp \text{ and } v \notin V_c] \leq 2^{-c+1}. \quad (VI.7)$$

Now one can estimate the probability of the second event. Note that if $v \in V_c$, there is a least j such that $v \in V_j$. So, $$Pr[v \in V_c^\perp \text{ and } v \in V_c] \leq \quad (VI.8)$$

$$\sum_{j=2}^{c} Pr[v \in V_j \text{ and } v \in V_{j-1}^\perp \text{ and } v \notin V_{j-1}].$$

We have $$Pr[v \in V_j \text{ and } v \in V_{j-1}^\perp \text{ and } v \notin V_{j-1}] = Pr[v \in V_{j-1}^\perp \text{ and } v \notin V_{j-1}] \cdot Pr[v \in V_j | v \in V_{j-1}^\perp \text{ and } v \notin V_{j-1}] \leq 2^{-j+2} Pr[v \in V_j | v \in V_{j-1}^\perp \text{ and } v \notin V_{j-1}], \quad (VI.9)$$

where Eq. (VI.6) was used.

Now one can estimate the probability $Pr[v \in V_j | v \in V_{j-1}^\perp$ and $v \notin V_{j-1}]$. This is possibly nonzero only if $v \cdot v = 0$. Consider the space of all n-component vectors modulo vectors in $V_{j-1}$; this quotient space has dimension at least $n-(j-1)$. Let $\pi$ be the natural map from the space of all vectors to this quotient space. The vector $\pi v$ is nonzero by assumption. The vector $w_j$ is subject to at most j−1 independent constraints from $V_{j-1}$. Consider the space of possible $\pi w_j$, given that $w_j$ obeys those constraints; this space has dimension at least $n-2(j-1)$ and so the probability that a random vector in this space is equal to $\pi v$ is at most $2^{-(n-2j+2)}$. Hence, $Pr[v \in V_{j-1} | v \in V_{j-1}^\perp$ and $v \notin V_{j-1}] \leq 2^{-(n-2j+2)}$, so $Pr[v \in V_{j-1}$ and $v \in V_{j-1}^\perp$ and $v \notin V_{j-1}] \leq 2^{-n+j}$. So by Eq. (VI.8).

$$Pr[v \in V_c^\perp \text{ and } v \in V_c] \leq \sum_{j=2}^{c} 2^{-n+j} \leq 2^{-n+c+1}. \quad (VI.10)$$

By a union bound, adding probabilities in Eqs. (VI.7,VI.10), the lemma follows. □

Lemma 5. Let n, c, d be such that $$(2^{-n+c+1} + 2^{-c+1}) \sum_{w=1}^{d} \binom{n}{w} < 1. \quad (VI.11)$$

Then, there exists an c-by-n matrix M such that $MM^T=0$ and such that $Mv \neq 0$ for any $v \neq 0$ with v having Hamming weight at most d.

Proof. This follows from lemma 4 and by a first moment bound. For random M from the above ensemble, the average number of vectors $v \neq 0$ with Hamming weight at most d such that $M^T v = 0$ is at $$\left(\sum_{w=1}^{d} \binom{n}{w}\right) \cdot (2^{-n+c+1} + 2^{-c+1}).$$

□

Lemma 6. For any fixed d, one can find a family of M with increasing n such that the ratio c/n tends asymptotically to zero and such that Eq. (VI.11) is obeyed. Hence, for any distance d, one can find a family of even or odd weakly self-dual CSS codes such that the ratio $k_{inner}/n_{inner} \rightarrow 1$ as $n_{inner} \rightarrow \infty$.

Proof. Immediate for the even case. Since the lemma 4 upper bounds the probability that an operator commutes with the stabilizer group one can also puncture these codes to obtain an odd code. □

C. Outer Codes

In this subsection, families of outer codes are constructed with good check rate and sensitivity. The discussion begins with a randomized construction, and then it is shown how to construct explicit families using previous results in coding theory.

Lemma 7. There exist families of outer codes with good check rate and sensitivity and even row weight.

Proof. Consider a random m-by-$n_{outer}$ parity check matrix M. Let $\tilde{d}=n_{outer}-1$. Choose each row independently but with the constraint that it should be of even weight. For any vector 1, with $|v| \leq \tilde{d}$, the syndrome vector Mv has independent entries from the uniform distribution. Thus, the probability that $|Mv| \leq s$ for $s \leq m/2$ is bounded by $$2^{-m} \sum_{i \leq s} \binom{m}{i} = O^*(2^{m(H(s/m)-1)}),$$

where $H(p) = -p \log_2(p) - (1-p) \log_2(1-p)$ is the binary entropy function. The number of such vectors v is bounded by $2^{n_{outer}}$. By a union bound, the probability that there is an error vector v of weight less than $\tilde{d}$ such that the syndrome has weight less than s is bounded by $$O(2^{m(H(s/m)-1)}2^{n_{outer}} = O^*(2^{n_{outer} \cdot (1+(m/n_{outer})(H(s/m)-1))}).$$

For sufficiently large ratio $m/n_{outer}$ and sufficiently small ratio $s/m$, this quantity is exponentially small in $n_{outer}$. □

The above randomized construction is very similar to randomized constructions of classical codes with good rate and distance, where it is defined Definition 7. A family of classical error correcting codes with increasing number of bits n has good rate if the number of encoded bits k is $\Theta(n)$ and has good distance if the distance d is $\Theta(n)$.

That is, even though very different properties are being considered (number of violated checks rather than distance of the code), the first moment argument above is very similar to standard first moment arguments to construct such codes with good rate and distance, with some additional technicalities required to ensure even weight of the parity checks. This is not a coincidence. As will now be shown, given a family of codes with good rate and distance, one can construct a family of codes with good check rate and sensitivity.

Lemma 8. Let C be a classical error correcting code that encodes k bit messages into n bit codewords. Let C have distance d. Let $v_1, \ldots, v_k$ be a basis for the codewords of C. Let M be the n-by-(k+1) matrix whose columns are the vectors $v_1, \ldots, v_k$, w where $w = v_1 + \ldots + v_k$. Then, all rows of M have even weight and M is a parity check matrix for a code with $n_{outer} = k+1$ bits which is $(\tilde{d},s)$ sensitive with $s=d$ and $\tilde{d} = n_{outer} - 1$. Thus, the code with parity checks encoded by M has only two codewords (the all 0 vector and the all 1 vector) and any message which is not a codeword will violate at least d checks.

Proof. For any (k+1)-bit vector v, the vector Mv is a codeword of C. If v is nonzero and is not equal to the all 1 vector, then Mv is a nonzero codeword of C and hence has weight at least d. □

Since $n_{outer} = k+1$, in order to obtain an even $n_{outer}$, if C has k even, one can simply define a new code C' which encodes k-1 bit messages into n bit codewords by using any (k-1)-dimensional subspace of the codewords of C, in this way obtaining a parity check matrix for a code with $n_{outer} = k - 1 + 1 = k$.

Using lemma 8, one can construct explicit families of codes with good check rate and good sensitivity given any explicit family of codes with good rate and good distance. As an example of such a code family, one can use the expander codes of Michael Sipser and Daniel A Spielman. "Expander codes," IEEE Transactions on Information Theory 42, 17101722 (1996).

Lemma 9. Given integers $\tilde{d}$, $w \geq 1$ and $s \geq 2$, there exists an $m \times n_{outer}$ parity check matrix M that is $(\tilde{d},s)$-sensitive where $m = n_{outer} \cdot s/w$ and every row of M has weight w exactly.

Proof. A parity check matrix M defines a bipartite graph G, often called a Tanner graph. One set of vertices of the graph (which we call B labeled by the columns of M) corresponds to bits of the code and the other set (which we call C labeled by the rows of M) corresponds to checks, with an edge between a pair of vertices if M is nonzero in the corresponding entry. Equivalently, given such a bipartite graph G, this defines a parity check matrix. It can be claimed that given a bipartite graph with all vertices in B having degree s and all vertices in C having degree w and with girth $> 2\tilde{d}$, the corresponding parity check matrix defines a code with the desired properties. Once this has been shown, the lemma follows, since Z Furedi. Felix Lazebnik. A Seress. Vasiliy A Ustimenko, and Andrew J Woldar, "Graphs of prescribed girth and bi-degree," Journal of Combinatorial Theory, Series B 64, 228-239 (1995) shows the existence of such graphs.

Note first that the degree of vertices in C corresponds to the row weight of M. Next, note that if all vertices in C have degree w and all in B have degree s, then $$m = |C| = n_{outer} \frac{s}{w}$$

with $n_{outer} = |B|$.

To prove the claim, let V ⊂ B be a nonempty set of erroneous bits. By assumption, $1 \leq |V| \leq \tilde{d}$. Consider a subgraph H of G defined by all vertices of V and its neighbors. By the girth condition on C, the subgraph H has to be a collection of disjoint trees. Thus, it suffices to prove the claim in case where H is connected. If $|V|=1$, then the error violates s checks, and the proof is done. If $|V| \geq 2$, let $v_1$, $v_2 \in V$ be a pair that are the furthest apart. The choice of the pair ensures that each of $v_1$ and $v_2$ has s-1 leaves attached to it. Therefore, V violates at least $2s-2 \geq s$ checks. □

Note that the ratio $m/n_{outer} = s/w$ in lemma 9 is the best possible, because each bit must participate in at least s checks (e.g., every column of the parity check matrix must have weight at least s).

Now consider the question of finding small Tanner graphs with the desired properties. It will now be shown that any such Tanner graph with girth 6 or more (which implies that the checks are non-overlapping) and which defines a code with distance 7 or more will give an outer code that gives seventh order reduction in error when used with an inner code of distance 7 or more. First, any single input error will violate 3 checks, since every bit is in three checks. Any pair of input errors on qubits $q_1$, $q_2$ must violate at least 4 checks (each qubit is in 3 checks, and since the checks are non-overlapping, there is at most one check containing both $q_1$, $q_2$). Any three input errors on qubits $q_1$, $q_2$, $q_3$ must also violate at least 3 checks (there is at most one check containing $q_1$, $q_2$ and at most one check containing $q_2$, $q_3$ and at most one check containing $q_1$, $q_3$). Any four input errors on qubits $q_1$, $q_2$, $q_3$, $q_4$ must violate at least 2 checks (the number of violated checks must be even since there are an even number of input errors, and by the distance assumption, there is no pattern on four qubits that violates no checks). By the distance assumption, any five or six input errors must violate at least one check.

Numerical searches were performed for graphs with the needed girth which defined a code with the needed distance as follows: an integer m was chosen and an outer code searched with $mk_{inner}$ qubits and 3m checks. The search was an iterative randomized procedure. The graph was initialized by taking in copies of the complete bipartite graph on $k_{inner}$ qubits and 3 checks. This initial graph clearly does not obey the girth bound (all three of the checks in each copy are identical). An iterative random search was performed to find a graph with girth 6 or more; this search proceeded by first finding a 4-cycle, then choosing an edge (q,C) between a qubit q and an edge C in that 4-cycle, then choosing another random edge (q',C') and replacing the pair (q,C) and (q',C') with (q,C') and (q',C). This procedure was repeated until the graph had girth 6 or more. Then, an additional random search was performed; this search also replaced pairs of edges (q,C) and (q',C') with (q,C') and (q',C); in this case, the pairs were chosen randomly subject to the constraint that no 4-cycle is created. After a large number of such steps, the determination of whether the resulting code had distance 7 was tested; this test was done by searching for an error pattern of weight 6 or less that does not violate an outer code check; some tricks were done to speed this search (for example, if a qubit q has an error, and if q is in checks $C_1$, $C_2$, $C_3$ then there must be qubits $q_1 \in C_1, q_2 \in C_2, q_3 \in C_3$ with $q_1, q_2, q_3 \neq q$ such that $q_1, q_2, q_3$ all have errors).

For $k_{inner}$=5, 7, 9, 11, 13, for m=$k_{inner}$+1, graphs were found with girth 6 by random search. Note that there exist graphs with girth 6 with m=$k_{inner}$ (the grid code with horizontal, vertical, and one diagonal is an example of such). The graphs give concrete examples of outer codes which obey the distance and sensitivity bounds.

Outer codes were also found that obey the distance and sensitivity bounds with $n_{outer}$=m$k_{inner}$ qubits for smaller values of m by taking more checks. This was done by finding graphs of girth 6 or more as described above and then performing a large number of random updates of these graphs keeping girth ≥6. Then, if the resulting code had distance 5 or 6, attempts were made to numerically find whether one could add a small number of checks to that code to obtain a code with distance 7, repeating the search until success. The resulting code then gives seventh order reduction and, since only a few checks are added, has close to the minimum number of input magic states.

The results of these searches are shown in table I.

TABLE I

For given degree equal to $k_{inner}$, the second column labelled m shows the minimum m at which we found a constant degree Tanner graph giving a code obeying the weight and sensitivity bounds. The third column m with added checks shows the minimum m giving a code obeying the weight and sensitivity bounds where we add one or two checks to a constant degree Tanner graph.

| $k_{inner}$ | m | m with added checks |
|---|---|---|
| 5 | 7 | |
| 7 | 13 | 10 |
| 9 | 19 | 14 |
| 11 | 33 | 20 |
| 13 | 45 | 29 |

VII. Numerical Simulation

In this section, results of numerical simulations are given. The discussion begins with an explanation of the error model used for simulations. The discussion also includes an explanation of two protocols that are simulated and that have not been explained previously; one of these protocols uses a [[21,3,5]] code. Simulation results are the given. One interesting result of the simulation is how little effect the subleading terms have, even at fairly large noise values.

A. Magic State Fidelity

When one injects a magic state μ for π/4 rotation into a quantum circuit, there is a probability for correction K by angle π/2 to be applied. If one represents the overall procedure by a quantum channel $C_\mu$, it is $C_\mu(\rho) = \Pi_+(\rho \otimes \mu)\Pi_+ + K\Pi_-(\rho \otimes \mu)\Pi_- K^\dagger$, where $\Pi_\pm$ denotes the measurement combined with a control-Pauli on the magic state and a target data qubit. Let $|\mu_0\rangle$ be the ideal magic state, and $|\mu_0^\perp\rangle$ be the orthogonal state. Then, it is straightforward to calculate that $C_{|\mu_0\rangle\langle\mu_0^\perp| + |\mu_0^\perp\rangle\langle\mu_0|}(\rho) = 0$.

This implies that for any initial approximate magic state μ, the result of the injection is the same as if μ had been through a twirling channel ε that dephases the magic state in the basis $\{|\mu_0\rangle, |\mu_0^\perp\rangle\}$:

$$\mu = \begin{pmatrix} 1-\epsilon & * \\ * & \epsilon \end{pmatrix} \xrightarrow{\varepsilon} \begin{pmatrix} 1-\epsilon & 0 \\ 0 & \epsilon \end{pmatrix}. \quad (\text{VII.1})$$

The twirled state is ε away from the ideal state in the trace distance, resulting in error at most ε to the quantum circuit's outcome. (The trace distance is defined as $T(\rho, \sigma) = \frac{1}{2}\|\rho - \sigma\|_1$.) The error ε can be expressed by the squared fidelity as $$1-\epsilon = F^2(\mu_0, \mu) = \langle\mu_0|\mu|\mu_0\rangle = \langle\mu_0|\varepsilon(\mu)|\mu_0\rangle. \quad (\text{VII.2})$$

(The fidelity is defined as $F(\rho,\sigma) = \|\sqrt{\rho}\sqrt{\sigma}\|_1$, which is equal to $|\langle\rho|\sigma\rangle|$ for pure ρ and σ.) This formula is convenient in that it yields the same answer regardless of whether or not twirling is applied to μ (this is the last equality in the above formula). When a state $\mu_n$ that approximates $\mu_0^{\otimes n}$ is injected, the error from this multi-qubit magic state is given by $1 - F^2(\mu_0^{\otimes n}, \mu_n)$. Note that $F^2(\mu_0, \mu)$ is linear in μ. Below, $1 - F^2$ is used as the probability of error to report the simulation results.

B. Error Models

The typical model to analyze distillation protocols is the stochastic error model. In typical distillation protocols, one has only a single output, magic state, and so one is interested in the probability that the output magic state has an error as a function of the input, conditioned on no error being detected by the code; the error probability is a ratio of polynomials in ε, with the leading term being of order $\epsilon^d$ for some d, with an integer coefficient.

For purposes of this discussion, since the codes used are fairly large, enumeration of all possible error patterns becomes difficult, especially if one wishes to go beyond leading order in t. For this reason, numerical simulation is used. One could simulate a mixed state, using a quantum channel to describe an approximate T-gate; however, this is numerically prohibitive and it is preferred to use an approach that involves only pure states. One could numerically simulate pure states using the stochastic error model by choosing errors to occur with probability p, and sampling the output error probability. However, this simulation also becomes difficult, precisely because the codes lead to a high suppression in the error. For example, if the target error probability is $10^{-10}$, one would require $\sim 10^{10}$ samples, with a fairly large number of qubits needed to be simulated in each run, to determine the output error probability accurately.

While there may be ways to overcome this sampling issue using importance sampling, in certain embodiments of the disclosed technology, another method is used. Instead of rotating by either π/4 or by 5π/4 as in the stochastic error model, each T gate rotates by an angle chosen uniformly in the interval [π/4−θ, π/4+θ], for some angle θ>0. Then, conditioned on the code not detecting an error, one can determine the error in the output state.

In fact, the model with input angles [π/4−θ, π/4+θ] and the stochastic error model describe the same average input state, assuming an appropriate choice of ϵ and θ.

$$\frac{1}{2\theta}\int_{[-\theta,+\theta]} dx \begin{pmatrix} \cos^2\frac{x}{2} & \sin\frac{x}{2}\cos\frac{x}{2} \\ \sin\frac{x}{2}\cos\frac{x}{2} & \sin^2\frac{x}{2} \end{pmatrix} = (1-\epsilon)\begin{pmatrix} 1 & 0 \\ 0 & 0 \end{pmatrix} + \epsilon\begin{pmatrix} 0 & 0 \\ 0 & 1 \end{pmatrix} \quad \text{(VII.3)}$$

$$\frac{1}{2} - \frac{\sin\theta}{2\theta} = \epsilon$$

Hence, one wants $\epsilon \approx \theta^2/12$. (It is emphasized that this is in a notation where θ is the rotation angle in the Bloch sphere; the T-gate is a rotation by π/4, not by π/8.) From this equation, it is evident that the sample average in the random angle model converges faster to its true average. In the stochastic error model with small e, one must do roughly 1/e runs to obtain meaningful statistics, while here, one needs only a constant number of runs.

C. Other Protocols

1. [[16,2,4]] Inner Code

In subsubsection III B 2 it was explained that a protocol using a [[16,6,4]] inner code. This required using a total of 17 physical qubits, namely 16 for the code and one ancilla. One can also modify this inner code to a [[16,2,4]] inner code by turning some of the logical operators into checks. This inner code suffices to implement the H-measurements on pairs of states (23), (45), (61) and so it can implement the checks of the outer code used in subsubsection III B 2. Using a [[16,2,4]] inner code, if one wants to have $n_{outer}=6$, a total of 21 physical qubits can be used, since one needs 16 for the code, plus 4 for the logical qubits not encoded in the code, plus one ancilla. Thus, this requires additional physical qubits compared to the [[16,6,4]] code. The reason for considering the [[16,2,4]] code in numerics is to see if it reduces the prefactor in the error, since the [[16,2,4]] code has fewer logical operators than the [[16,6,4]] code. The protocol can be pipelined e.g., with the [[16,2,4]] inner code in the same way as done with the [[16,6,4]] inner code.

Figure 6:
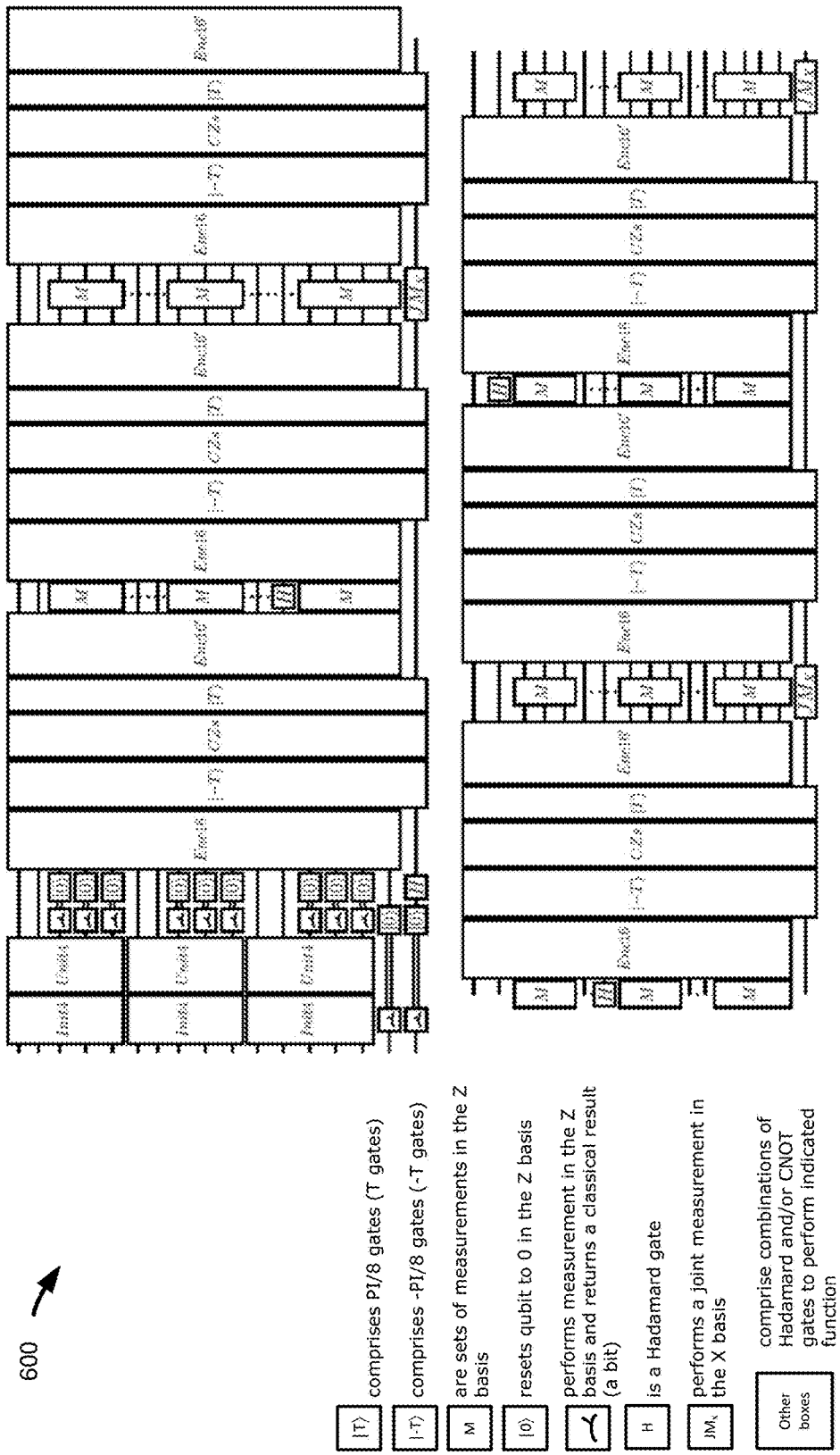
FIG. 6 is a diagram showing an example pipelined circuit using [[16,6,4]]code.

See FIG. 6 in Section XI.

2. [[21,3,5]] Inner Code

Another inner code that was used is a [[21,3,5]] inner code. This allows one to obtain fifth order reduction in error. $n_{outer}=4$ was used with the outer code having check matrix $$M = \begin{pmatrix} 1 & 1 & 1 & 0 \\ 1 & 1 & 0 & 1 \\ 1 & 0 & 1 & 1 \\ 0 & 1 & 1 & 1 \end{pmatrix} \quad \text{(VII.4)}$$

It uses 4 checks for 4 qubits. This matrix is not (4,2)-sensitive, but is sufficient to achieve fifth order reduction in error since $2|Mv|+|v|\geq 5$ for every nonzero v. See FIG. 9 in Section XI.

A simple pipelining can reduce the noisy T gate count compared to this protocol. Distill three independent magic states using [[7,1,3]] inner code. (The outer code is trivial in this case.) The three distilled magic states are then pipelined into the [[21,3,5]] inner code. This produces 3 magic states with error $O(\epsilon^5)$, consuming, per output, 28 T gates and one T state with error ϵ.

Without pipelining, but using weight 3 checks from [[21,3,5]], one can find an outer code that is (4,2) sensitive using (⅔)$n_{outer}$ checks. This produces $n_{outer}$ magic states with fifth order error suppression, consuming 42·⅔=28 T gates and one T state, per output. The smallest such outer code is explained elsewhere herein, where it is called the Petersen graph code.

D. [[23,1,7]] Inner Code

A [[23,1,7]] inner code is also given in this disclosure. Pipelining this code with a [[7,1,3]] and a [[17,1,5]] inner code gives $n_{outer}=1$ with error $O(\epsilon^7)$. One could also apply this code to each of the output bits of any of the other fifth order protocols of section VII C 2 to obtain error $O(\epsilon^7)$.

E. Results

Figure 5:
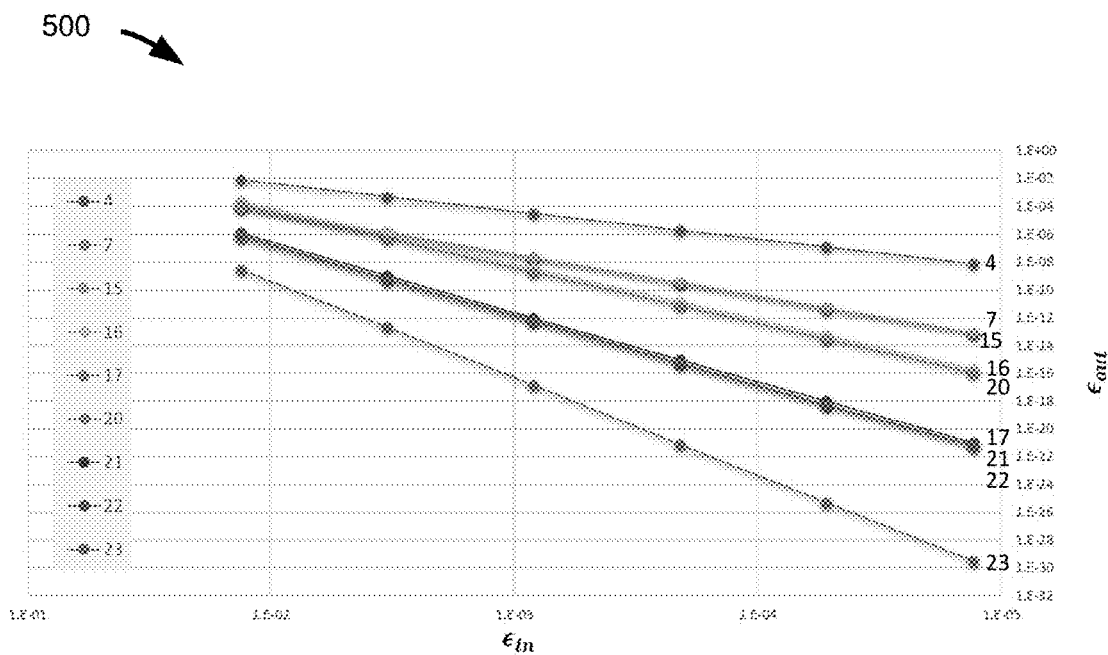
FIG. 5 shows results of numerical simulations relating to the disclosed technology.

The results of the simulations are shown in FIG. 5. Note that the plots are close to linear on a log-log plot, with only small deviations at high error rate. Each data point represents the average of at least $10^4$ runs, with statistical fluctuations negligible on the scale of the plot. The asymptotic behavior is within statistical error of that given by an enumeration of minimum weight error patterns.

The protocol using [[16,2,4]] inner code has a slightly reduced output error, compared to the protocol using the [[16,6,4]] inner code.

It is emphasized that $\epsilon_{out}$ indicates the probability that there is any error in the output state which is a multi-qubit state. Suppose that two protocols give the same value of $\epsilon_{out}$ for a given $\epsilon_{in}$, but one protocol has a large $n_{outer}$. If the total number of magic states is large compared to $n_{outer}$, the number of times one desirably calls the protocol is inversely proportional to $n_{outer}$, and so the protocol with the larger $n_{outer}$ for the given $\epsilon_{out}$ is less likely to produce an error.

The probability that no error is detected by the protocol is roughly $(1-\epsilon_{in})^{nT}$. This result would be exact if any error in an input T gate led to the protocol detecting an error. Instead, some high weight error patterns do not lead to any error detected by the code, leading to slight corrections to this formula.

FIG. 5 shows results of numerical simulations. $\epsilon_{in}$ represents input error; this is the error ϵ of Eq. (VII.3) for the given θ. $\epsilon_{out}$ is the average of $1-\langle\mu_0|\mu|\mu_0\rangle$ over runs. The numbers labelling curves indicate the number of physical qubits, not including the ancilla qubit. Specifically, 4 indicates protocol using [[4,2,2]] inner code. 7 indicates protocol using [[7,1,3]] inner code. 15 is the Bravyi-Kitaev 15-to-1 protocol included for comparison purposes; 7 and 15 have almost identical performance. 16 is pipelined protocol using [[16,6,4]] inner code; 20 is pipelined protocol using [[16,2,4]] inner code. 17 is pipelined protocol using [[17,1,5]] inner code. 22 is protocol using [[21,3,5]] inner code with $n_{outer}=4$. 21 is protocol using [[21,3,5]] inner code pipelined with [[7,1,3]] inner code. 17, 21, and 22 have almost identical performance. 23 is protocol using [[23,1,7]] inner code.

VIII. Protocols at Intermediate Size

In this section, a family of protocols that work well at intermediate sizes is presented. These protocols achieve a ratio $n_T/n_{outer}$ that is fairly close to asymptotically optimal (e.g., close to 6) even for modest sizes. They also achieve a high success rate by a modification of the previous protocols: the usual approach is that if an error is detected, either by a stabilizer measurement of the inner code or by a measurement of the outer code, a failure is declared and the process is tried again. Instead, in certain embodiments, an error correction scheme is used in some cases to fix errors while maintaining seventh order reduction in error.

The first ingredient is an inner code. In certain example embodiments, quantum BCH codes are used. See Markus Grassl and Thomas Beth, "Quantum bch codes," arXiv preprint quant-ph/9910060 (1999). There are quantum BCH codes that are weakly self-dual CSS codes, with parameters such as [[63,27,7]] or [[63,39,5]] or [[127,85,7]] or [[127,99,5]]. Thus, the ratio $k_{inner}/n_{inner}$ is fairly large for these codes even at modest sizes for distance 5 or 7.

The second ingredient is an outer code. Here, a few possibilities can be considered. Before generalizing, consider the following example. Let $n_{outer}=mn$, for some m, n, and imagine the qubits as arranged in an m-by-n grid. One can take $m=k_{inner}$ for some given inner code and $n=k_{inner}$ for some other inner code. The outer code has two types of checks, corresponding to rows and columns of the grid. These checks can be paralleized, so that all checks of a given type are performed at the same time. In particular embodiments, the rows are done first, then the columns (though other embodiments use the reverse order); the row measurements can be done in parallel, as can the column measurements.

This outer code has distance four, and this protocol will achieve fourth order reduction in error. One can say that a row or column detects an error if there is an error detected by either the stabilizer measurements of the inner code for that column or by the check of the outer code for that column. One can also say that there is a measurement in the check of an outer code if the check shows no error but there is indeed an error.

In certain example embodiments, the following protocol is performed:
1. Check the rows using any inner code of distance at least 2. If there is an error detected by any given row R, re-initialize the qubits in that row to approximate magic states and repeat the measurement on the row. At this point, the rows are independent (unentangled with each other), so repeating the measurements on a given row has no effect on the other rows.
2. Check the columns using any inner code of distance at least 4. If there is an error detected by any column, discard the qubits in that column.
3. The remaining qubits are approximate magic states with error $O(\epsilon^4)$.

Before analyzing the output error rate, a distinction will first be discussed. Previously, when showing that an output error was reduced to fourth order (for example), it sufficed to show that any pattern of T-gate errors which led to no error being detected and which led to an output error had at least four T-gate errors. Now, however, one is conditioning on the fact that some errors did occur: for example, if an error is detected by a stabilizer measurement in some column, it is known that at least one T-gate error occurred when acting on the encoded state (and possibly more occurred); thus, it should be shown that the number of T-gate errors required to produce an output error is at least four more than the number of T-gate errors known to occur. This will be assumed in what follows, without being stated explicitly, so that all counts of number of T-gate errors do not include the known errors.

There are two points to consider. The first is to show that the output error is indeed $O(\epsilon^4)$. Consider any output magic state in qubit q. Qubit q is in some row R and column C. Consider the following possibilities. First, suppose that there is no logical error in row R. This breaks into two subcases. In the first subcase, suppose that there is no error in measurement of the outer code in row R. Then, there must be some other qubit q' in row R which is also input with an error. No error is detected by column C, so either there is a measurement error of the outer code in column C (in which case the total number of T-gate errors is at least 4, given 1 for q, 1 for q', and 2 for the measurement error) or there is another qubit q" in column C which also has an error. However, since q" is in some row R'≠R, and R' does not detect an error, again the total number of T-gate errors is at least 4. In the second subcase, suppose that there is an error in measurement of the outer code in row R. Then, since q has an error also, the total number of T-gate errors is at least 3, and further q will also be measured in some column C so if not error is detected there, the weight must be more than 3.

Suppose instead there is a logical error in row R. Thus, one can have a situation where qubit q has an error after measuring the row and only two T-gate errors have occurred. However, then q is measured in some column and again the total number of errors must be at least 4.

The second point is the success rate: in this case, one does not mind discarding all qubits in a row R as this affects only that row. The number of T-gates in a row is ~n, and so for $\epsilon n \lesssim 1$, there is a good probability of accepting each row. If instead one had discarded all rows when any single error was detected, one would need $mn\epsilon \lesssim 1$.

The above procedure can be generalized to a three dimensional grid; for simplicity, consider size $n^3$, although one may also consider different sizes in each direction. This discussion refers to rows, columns, and verticals to denote the three directions. The outer code again measures each of the three directions in turn, first, rows, then columns, then verticals. This outer code has distance 8, but one can achieve seventh order reduction in error. This is the best possible outcome given that each qubit is in only three checks.

At this point, a new modification is introduced to the protocol: error correction. In particular embodiments, the following protocol is used:
1. Check the rows using any inner code of distance at least 3. If there is an error detected by any given row R, re-initialize the qubits in that row to approximate magic states and repeat the measurement on the row. At this point, the rows are independent (unentangled with each other), so repeating the measurements on a given row has no effect on the other rows.
2. Check the columns using any inner code of distance at least 7. If the inner code stabilizers detect an error in any column C, and that error syndrome can be caused by at most 1 error inside the inner code, apply an error correction to fix those errors, and then repeat the measurement in that column, continuing until no errors are detected. If the outer code check detects an error, discard all qubits in the vertical plane which contains that given column and repeat steps 1, 2 on the qubits in that plane.
3. Check the verticals using any code of distance at least 7. If any error is detected by a measurement of an outer code check, discard all qubits and repeat the protocol from the beginning. Otherwise, if an error is detected by an inner code stabilizer, discard the qubits in that diagonal but not in the other diagonals where no inner code stabilizer detects an error. Return all qubits which are not discarded as approximate magic states; they have error $O(\epsilon^7)$.

Note that in step 2, if an error syndrome can be caused by at most 1 error, and a correction is applied, it is possible that a logical error is produced. It is possible that there were actually 6 or more errors inside the inner code, and the correction led to a weight 7 logical error. In this case, the difference between the known number of T-gate errors (1) and the actual number (at least 6) is at least 5, so the effect of the correction is to make it as if the inner code in step 2 only had distance 5.

Thus, one should analyze a protocol as if the codes has distance 3,5,7 for rows, columns, verticals. However, such a code indeed leads to a seventh order reduction in error.

The reason for the error correction step is to reduce the change of having to discard all qubits in a given plane. The number of T-gates applied in checking columns in any given plane is $\sim n^2$, and so if one discarded all qubits in a plane whenever any error was detected by the inner code, one would need $\epsilon n^2 \lesssim 1$. Instead, discarding can be performed in a plane due to inner code errors if there are at least 2 errors in a given column; to make this probability small, one needs $(\epsilon n)^2 n = \epsilon^2 n^3 \lesssim 1$.

Finally, consider the probability of having to discard a plane due to errors in an outer code measurement in a column. After the first round of row measurements, the error probability for qubits in any row is $\sim \epsilon^2$ for any given qubit, so the probability of discarding a plane is $\sim \epsilon^2 n^2$, rather than $\epsilon n^2$ as one might have guessed.

A final interesting outer code to consider is a modification of the two dimensional grid, where now one can add an additional check on the diagonals. This outer code has distance 6. Distance 6 or higher codes can be used to perform the checks. In such cases, the rows can be checked, then the columns, then the diagonals (different orders are also possible). The same error correction as in the three dimensional grid can be used: one can correct column measurements with at most 1 error in the inner code.

IX. Discussion

In this disclosure, a general scheme has been given to construct distillation protocols using inner and outer codes. If desired, these protocols can be concatenated with other protocols. However, on their own, they achieve optimal asymptotic behavior, as well as having small size examples which perform well.

One of the advantages of these protocols is the small number of qubits that they use, as they maintain a constant ratio of physical to logical qubits in the asymptotic limit. In Cody Jones, "Multilevel distillation of magic states for quantum computing," Phys. Rev. A 87, 042305 (2013), 1210.3388v2, another family of protocols giving $\gamma \to 1$ was constructed. However, this protocol, like most distillation protocols involving concatenation, required a large overhead of physical to logical qubits. The benefits of reduced overhead may be even more important if possible errors in the Clifford gates are taken into account.

It is interesting to consider the asymptotics of this overhead between physical and logical qubits. Note that given any distillation protocol, there is a trivial way to define a new protocol with a fixed ratio of physical to logical qubits. Suppose, for example, that some protocol uses $n_{phys}$ qubits to produce 1 output magic state. Call this protocol P. One can define a new protocol P' that works on $2n_{phys}$ qubits to produce $n_{phys}$ output magic states, which simply consists of applying P a total of $n_{phys}$ times sequentially. However, the T-gate circuit depth of P' now is proportional to $n_{phys}$ times the T-gate depth of P. In contrast, in Theorem 3, a d-th order error reduction is obtained at fixed ratio of physical to logical with a T-gate depth proportional to d. That is, the protocols that are discussed herein are space and time efficient.

X. Example Small Inner and Outer Codes

In this section, some specific inner and outer codes are given, either giving the stabilizers or referring to the literature. Some of these codes are explained in the basic distillation section III or in numerical simulations VII in the body of this disclosure. Other codes have other useful properties that are described for specific codes.

When stabilizers for an inner code are given, each row gives one stabilizer generator. Each row consists of a binary string, of length equal to the number of qubits, with a 1 indicating that that stabilizer acts on that qubit (the parity check matrix is given).

A. Inner Codes

1. [[4,2,2]] Inner Code

This is explained in Section III.

2. [[16,6,4]] Inner Code

The stabilizer matrix is the classical Hadamard code [16,5,8].
1111111111111111
1111111100000000
1111000011110000
1100110011001100
1010101010101010

3. [[7,1,3]] Inner Code

This is explained in Section III.

4. [[17,1,5]] Inner Code

This code is the smallest odd code that was found with $k_{inner}=1$ and distance 5. The stabilizers are:
11011010101000010
01100011001100110
00110110010011001
00010101000111110
00001110010011101
00000101000110000
00000011111011010
00000001010100001

5. [[21,3,5]] and [[23,1,7]] Inner Codes

The (extended) Golay code is a classical self-dual code which is [24, 12, 8]. Puncturing a bit by collecting all code words that has zero on that bit, one obtains a self-orthogonal [23,11,7]. From this, one can obtain a weakly self-dual CSS code which is [[23,1,7]]. There are many positions to puncture, but due to high symmetry of the Golay code, the resulting codes have the same weight enumerators. One can pipeline the [[23,1,7]] code after the protocol of section III A 2 to give a protocol with one output magic state and seventh order suppression in error.

By puncturing the [[23,1,7]] code twice, one obtains a [[21,3,5]] code. In a numerical search, a smaller odd code with $k_{inner}=3$ and distance 5 was found. The stabilizers of the [[21,3,5]] code are:

100000000011110110100
010000000001111011010
001000000110110011001
000100000011011001101
000010000001101100111
000001000110111000110
000000100101010010111
000000010100100111110
000000001100011101011

TABLE II

| Parameters of small even weakly self-dual CSS codes | | | | | | | |
| --- | --- | --- | --- | --- | --- | --- | --- |
| $n_{inner}$ | 16 | 20 | 24 | 28 | 30 | 20 | 28 | 30 |
| $k_{inner}$ | 6 | 8 | 12 | 14 | 16 | 2 | 4 | 6 |
| d | 4 | 4 | 4 | 4 | 4 | 6 | 6 | 6 |

The code [[20,2,6]] can be constructed from the five-qubit code [[5,1,3]] by going through the Majorana operators, while the others cannot be constructed in this way. See Sergey Bravyi, Bernhard Leemhuis, and Barbara M. Terhal. "Majorana fermion codes," New J. Phys. 12, 083039 (2010), 1004.3791

6. Other Inner Codes

Some other examples of inner codes can be found in M. B. Hastings, "Small majorana fermion codes," 1703.00612, from which one can reproduce optimal $k_{inner}$ found for given distance and $n_{inner}$ in Table II. For stabilizers, see M. B. Hastings, "Small majorana fermion codes." 1703.00612.

B. Outer Codes

1. Petersen Graph Code

The outer code in section VII C 2 has 4 qubits, uses weight-3 checks and is (4,2) sensitive. However, from Lemma 9, it is known that there is some $n_{outer}$ such that there is a code which is (4,2) sensitive with weight-3 checks, which has only (⅔)n outer checks. This code is now explained. The proof of Lemma 9 reduces the problem of finding such a code to finding a bipartite graph G. Since the set B of that lemma has degree 2, one can equivalently define the code by a graph H such that the vertices of the graph H correspond to checks and the edges correspond to bits; e.g., in the case that B has degree 2, the possible bipartite graphs G are in one-to-one correspondence with degree-3 graphs H. Then, from the proof of Lemma 9, it is known that if H has girth at least 5, then the corresponding code is (4,2) sensitive. The smallest such graph H is known to be the Petersen graph. This is a degree-3 graph with 15 vertices and 10 edges.

Note that the girth being 5 is optimal in this case, because if H has girth 4, then there is a weight 4 error that violates no checks.

XI. Example Circuits

In this section, example circuits for some of the protocols above are disclosed. Boxes labelled Enc or Enc' denote encoding and decoding circuits, which are Cliffords. The number in the box indicates what code is used. H denotes Hadamard, M denotes measurement in Z basis, $JM_x$ denotes measurement in X basis, Czs denotes control-Z operations.

FIG. 6 is a block diagram 600 of an example pipelined circuit using [[16,6,4]] code described in section III B 2. Further, the legend in FIG. 6 applies to the FIGS. 7-9 as well.

Figure 7:
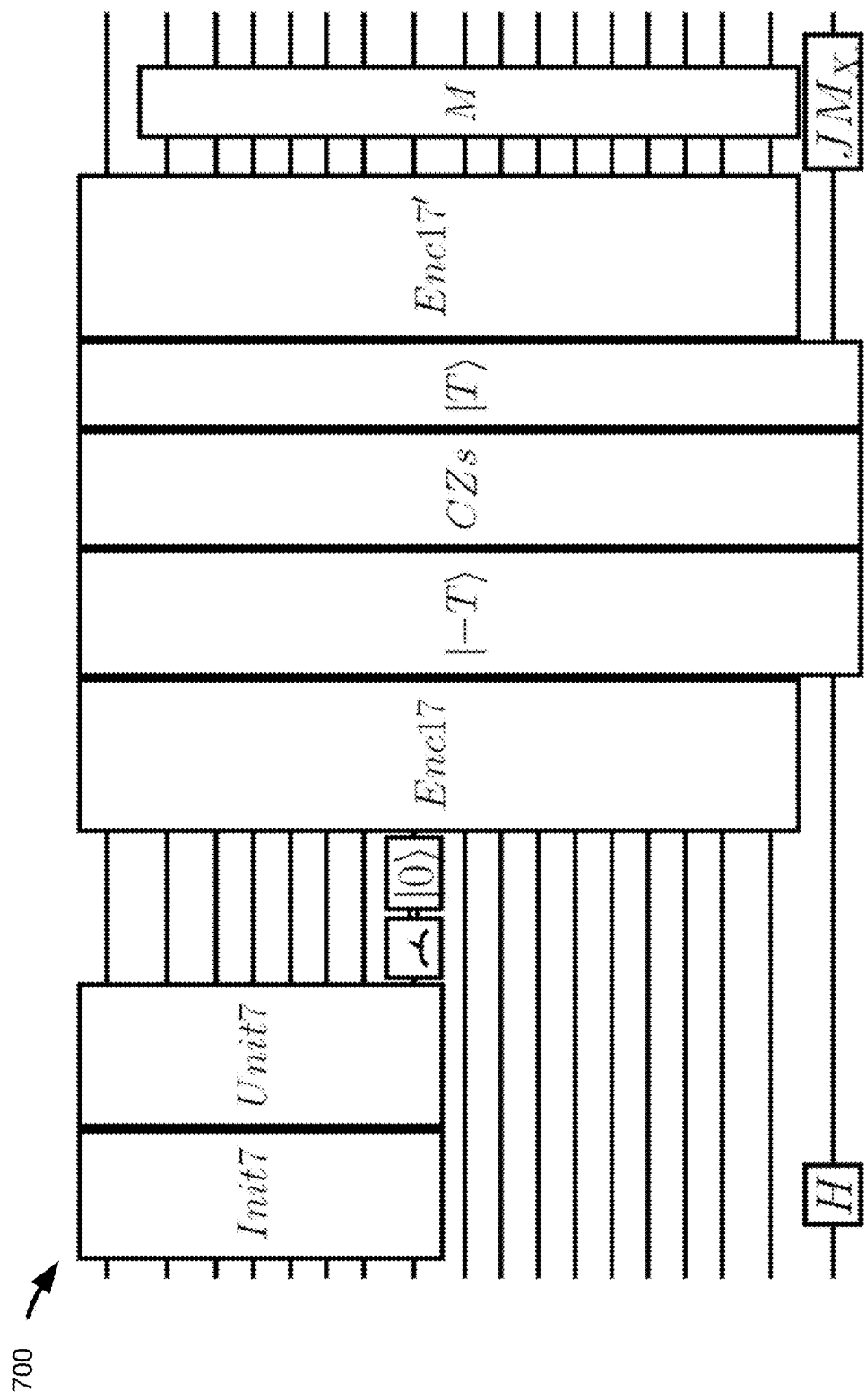
FIG. 7 is a diagram showing an example pipelined circuit using [[17,1,5]]code.

FIG. 7 is a block diagram 700 of an example pipelined circuit using [[17,1,5]] code described in section III A 2.

Figure 8:
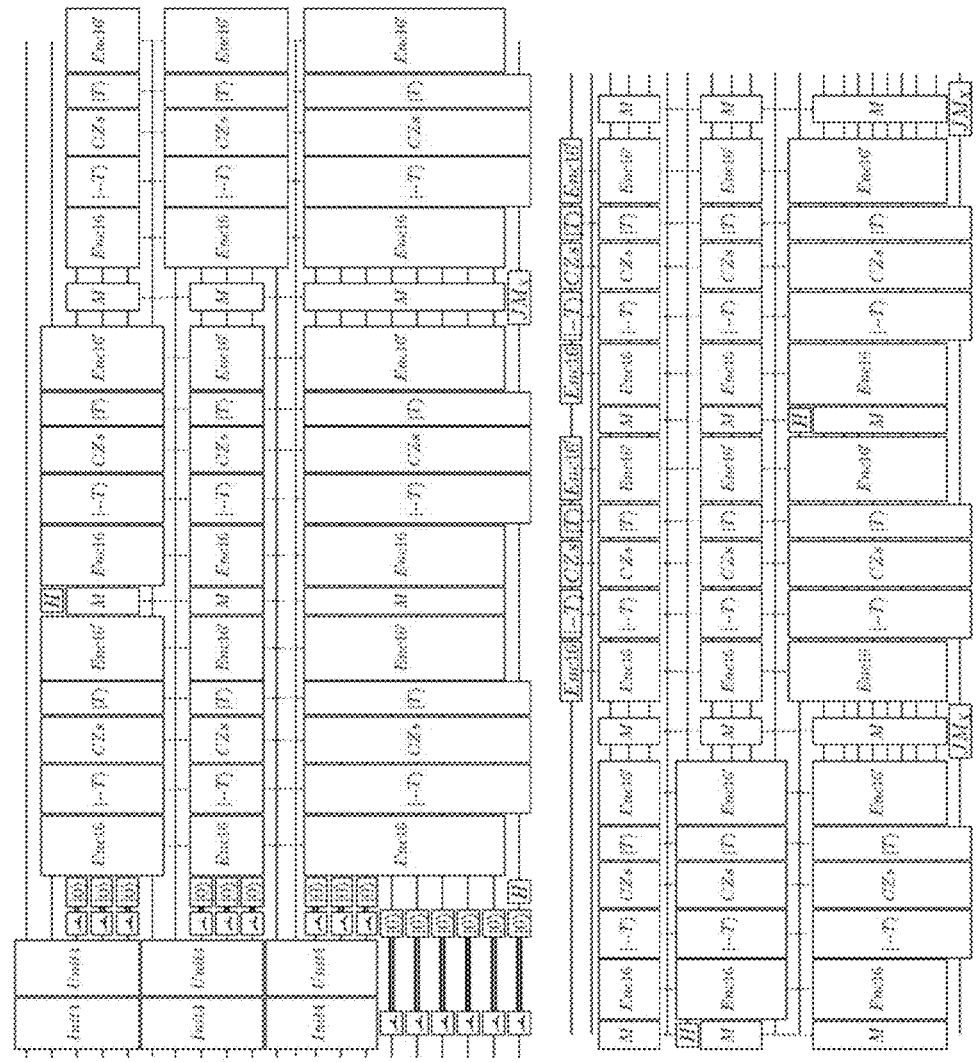
FIG. 8 is a diagram showing an example pipelined circuit using [[16,2,4]]code.

FIG. 8 is a block diagram 800 of an example pipelined circuit using [[16,2,4]] code described in section VII C 1.

Figure 9:
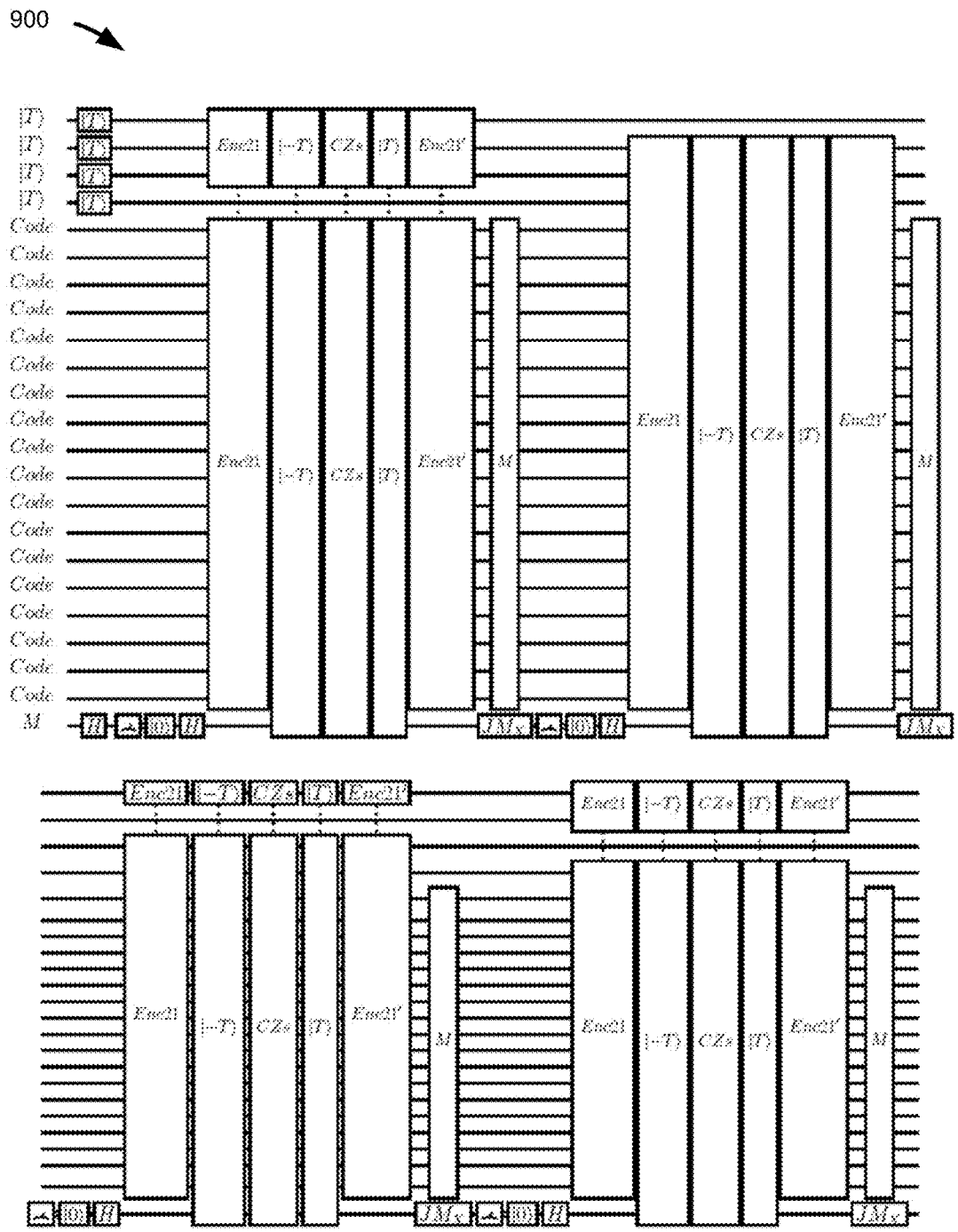
FIG. 9 is a diagram showing an example circuit using [[21,3,5]]code.

FIG. 9 is a block diagram 900 of an example circuit using [[21,3,5]] code described in section VII C 2.

XII. Coincidence Among Protocols

The Steane code has 7 Y-logical operators of weight 3. In the distillation protocol using the Steane code as the inner code, each logical error may appear in 4 different ways in the column that implements control-$H^{\otimes 7}$. The measurement error at the lowest order can happen in 7 ways. Overall, the cubic error can happen in 7·4+7=35 ways. This number matches the number of logical operators of weight 3 in the Bravyi-Kitaev 15-to-1 protocol. See Sergei Bravyi and Alexei Kitaev, "Universal quantum computation with ideal Clifford gates and noisy ancillas," Phys. Rev. A 71, 022316 (2005), quant-ph/0403025.

When [[7,1,3]] to [[17,1,5]] were pipelined, there are 48 T gates and 1 T state. The number of logical operators of weight 5 in [[17,1,5]] is 51. Each logical operator can appear in 16 different configurations in the column that implements control-$H^{\otimes 17}$. The measurement error from the 17-qubit code routine occurs in 17 ways at the leading order. Thus, the output error probability has leading term $(51 \cdot 16+35 \cdot 17)\epsilon^5 = 1411\epsilon^5$. The coefficient matches the number of Z-logical operators of weight 5 in the [[49,1,5]] code, as reported in Sergey Bravyi and Jeongwan Haah, "Magic state distillation with low overhead," Phys. Rev. A 86, 052329 (2012), 1209.2426.

Bravyi and Cross (see Sergey Bravyi and Andrew Cross, "Doubled color codes," 1509.03239v1) gave a recursive construction for triply even codes. They showed how to convert a pair of a (classical) triply even code of length $n_{t-1}$ with dual distance 2t−1 and some (classical) self-orthogonal code of length $m_t$ with dual distance 2t+1 into a triply even code of length $n_t=2m_t+n_{t-1}$ with dual distance 2t+1. The formula gives another coincidence with the pipeline. $n_{t-1}$ is the number of T gates/states, sitting before the final H-measurement routine in the pipeline, and $m_t$ is the code length of the final H-measurement routine. Thus, the recursive formula $n_t=2m_t+n_{t-1}$ correctly counts the number of T gates/states used in the pipeline.

A similar coincidence was observed by Jones (see Cody Jones, "Multilevel distillation of magic states for quantum computing," Phys. Rev. A 87, 042305 (2013), 1210.3388v2), where the leading error probabilities of the distillation protocols by a family of weakly self-dual [[k+4,k,2]] codes with (k,0)-magic basis and those by a family of triorthogonal codes (see Sergey Bravyi and Jeongwan Haah, "Magic state distillation with low overhead," Phys. Rev. A 86, 052329 (2012), 1209.2426) are shown to be the same as $(3k+1)\epsilon^2$. The total number of T gates/states were also the same as 3k+8.

XIII. Qudits

In this section, an extension to qudits is considered with local Hilbert space dimension p>2, with p a prime. Consider a basis of state $|j\rangle$, where j=0, 1, . . . , p−1 is periodic mod p. The following operators and phase factor are used $$\omega = e^{2\pi i/p}, \quad Z = \sum_j \omega^j |j\rangle\langle j|, \quad X = \sum_j |j+1\rangle\langle j|, \quad \text{(XIII.1)}$$

$$H = \frac{1}{\sqrt{p}} \sum_{j,k} \omega^{jk} |j\rangle\langle k|, \quad S = \sum_j \omega^{j(j-1)/2} |j\rangle\langle j|, \quad {}^C X = \sum_j |j\rangle\langle j| \otimes X^j,$$

$$U(n) = \sum_j |nj\rangle\langle j| \quad (n \neq 0)$$

which generate the Clifford group. It holds that $ZX=\omega XZ$.

In this section, a generalization of odd codes is used throughout, ignoring even codes. One reason is that one cannot achieve control-Swap in the same way as one could previously. The general method in the qubit case was to use some non-Clifford operation such as a T gate, conjugating controlled Pauli to obtain control-Swap on the code space of some code. However, Swap is of order 2 while control-Z is of order p. For odd codes, implementation of the control-Hadamard was not tired as before, because Hadamard is of order 4 for p>2, and hence is not conjugate to control-Z.

A. Preliminary

Let one first define a T-gate. The cases p=3 and p>3 are going to be different. Define $$g(j) := \sum_{k=0}^{j} \frac{1}{2} k(k-1) = \frac{1}{6}(j^3 - j), \quad \text{(XIII.2)}$$

$$g(j+p) = g(j) \bmod p \quad \text{if } p > 3 \quad \text{(XIII.3)}$$

where the second line is because 6 is invertible in $\mathbb{F}_{p>3}$, and ensures that g is a well defined function on $\mathbb{F}_{p>3}$. All arithmetic in the exponent of $\omega$, Z, X, and S will be over $\mathbb{F}_p$ for both p=3 and p>3. Define the T-gate as $$T = \sum_{j=0}^{p-1} \omega^{g(j)} |j\rangle\langle j|, \quad TXT^{-1}X^{-1} = S \quad \text{if } p > 3, \quad \text{(XIII.4)}$$

$$T = |0\rangle\langle 0| + e^{-2\pi i/9}|1\rangle\langle 1| + e^{2\pi i/9}|2\rangle\langle 2|, \quad TXT^{-1}X^{-1} = e^{-2\pi i/9}S \quad \text{if } p = 3. \quad \text{(XIII.5)}$$

These show that in both cases the T gate is at the third level of the generalized Clifford hierarchy. More generally, it is observed that $$T^m X T^{-m} = \begin{cases} S^m X & \text{for } p > 3, \\ e^{-2\pi i m/9} S^m X & \text{for } p = 3, \end{cases} \quad \text{(XIII.6)}$$

For both p=3 and p>3, define $|\psi_m\rangle$ for in =0, 1, ..., p-1 be the (+1)-eigenstate of $T^m X T^{-m}$:

$$T^m X T^{-m} |\psi_m\rangle = |\psi_m\rangle. \quad \text{(XIII.7)}$$

Any state $|\psi_m\rangle$ for m=1, ..., p-1 will be a "magic state."

How would one use these magic states? Suppose p>3. Consider a pair of qudits in a state $\Sigma_j a_j |j\rangle \otimes |\psi_m\rangle$. Apply a control-X operation with the first qudit as source and the second qudit as target. This maps the state to $$\frac{1}{\sqrt{p}} \sum_{j,k} a_j \omega^{mg(k)} |j, k+j\rangle. \quad \text{(XIII.8)}$$

Now measure the second qudit in the computational basis, obtaining a result l. This gives a state on the first qudit $\Sigma_j a_j \omega^{mg(l-j)} |j\rangle$. Thus, the transformation implemented on the first qudit is $\Sigma_j \omega^{mg(l-j)} |j\rangle\langle j|$. Expanding the exponent, one has $$mg(\ell - j) = mg(\ell) - mg(j) + \frac{m}{2}(\ell j^2 - \ell^2 j) \quad \text{(XIII.9)}$$

$$= mg(\ell) - mg(j) + m\ell \frac{j(j-1)}{2} - m\frac{\ell(\ell-1)}{2} j.$$

The first term on the right-hand side of Eq. (XIII.9) corresponds to an irrelevant global phase factor. The second term, $-mg(j)$, corresponding to implementing transformation $T^{-m}$ on the first qudit. The third term gives a phase factor that can be corrected by applying a power of the S gate and the last term gives phase factors that can be corrected by a power of the Z gate. Thus, the state injection procedure works, in that one can use a magic state $|\psi_m\rangle$ to produce a transformation $T^{-m}$ up to Clifford corrections.

When p=3, the same state injection can be used, with m=1. One finds after some calculation that if the measurement outcome is l=0, the implemented operations is $T^{-1}$ to the source, if l=1, it is $e^{-2\pi i/9} ST^{-1}$, and if l=2, it is $e^{2\pi i/9} Z^{-1} S^{-1} T^{-1}$. Thus, in all cases, the implemented operation is $T^{-1}$ up to a Clifford correction.

Note that $T^m$ and $T^{-m}$ are interconvertible by Cliffords. More generally, it is possible to use Clifford operations to convert a gate $T^m$ into another gate $T^{m'}$ with $m'=mn^3$ for $n\neq 0$, by $U=U(n)=\Sigma_j |nj\rangle\langle j|$ gate. For p>3, we have $U^\dagger T^m U = \Sigma_j \omega^{mg(nj)} |j\rangle\langle j|$ where $$g(nj) = \frac{1}{6}(n^3 j^3 - nj) = n^3 g(j) + \frac{n^3 - n}{6} j. \quad \text{(XIII.10)}$$

Thus $U^\dagger T^m U = T^{mn^3} Z^{m \frac{n^3-n}{6}}$, and so indeed $T^m = C_1 T^{m'} C_2$ for some Cliffords $C_1, C_2$. For p=3, we see $T=U(-1)T^{-1}U(-1)$. Now, for which pairs m,m' can we find an n such that $m'=mn^3$? The multiplicative group $\mathbb{F}_p^\times$ is cyclic of order p-1. Therefore, when p-1 is not a multiple of 3, then $\mathbb{F}_p^\times \ni n \mapsto n^3 \in \mathbb{F}_p^\times$ is a bijection, and any $T^m$ can be interconverted into any other $T^{m'}$. If p-1 is a multiple of 3, there are three distinct classes of T gates. Since $-1=(-1)^3$, $T^m$ and $T^{-m}$ are always interconvertible.

B. Inner Codes

For arbitrary vector $v \in \mathbb{F}_p^{n_{inner}}$ one can write $X(v) = X^{v_1} \otimes \ldots \otimes X^{v_n}$inner, and $Z(v) = Z^{v_1} \otimes \ldots \otimes Z_p^{n}$inner. As in the weakly self-dual CSS code construction for qubits, it is straightforward to define a stabilizer code starting from a self-orthogonal subspace $S \subset S^\perp \subset \mathbb{F}_p^{n_{inner}}$; The stabilizer group is generated by $X(v)$ and $Z(v)$ where $v \in S$. The quotient space $S^\perp/S$ is in one-to-one correspondence with the set of X-type (Z-type) logical operators, and the induced dot product on $S^\perp/S$ is non-degenerate. In Section XIV below, it is shown that there is a basis $\{v^{(1)}, \ldots, v^{(k_{inner})}\}$ of $S^\perp/S$ such that $v^{(i)} \cdot v^{(j)} = \alpha_j \delta_{ij}$ where the scalars $\alpha_j$ are all 1 possibly except the last one. For simplicity, the discussion is focused on cases where $$(1,1,\ldots,1) \in S, \tag{XIII.11}$$

$$v^{(i)} \cdot v^{(j)} = \delta_{ij}. \tag{XIII.12}$$

e.g., the second condition is that all scalars $\alpha_j$ are equal to 1. The first condition demands that $n_{inner}$ to be a multiple of p. The second is a mild restriction, since $(S \oplus S)^\perp/(S \oplus S)$ always has a basis such that (XIII.12) holds. Given a basis $\{v^{(j)}\}$ satisfying (XIII.12), one can define logical operators of the inner code as $$\tilde{X}^{(j)} = X(v^{(j)}),$$

$$\tilde{Z}^{(j)} = Z(v^{(j)}), \tag{XIII.13}$$

which indeed obey the commutation relation $$\tilde{Z}^{(a)}\tilde{X}^{(b)} = \omega^{\delta_{ab}}\tilde{X}^{(b)}\tilde{Z}^{(a)} \tag{XIII.14}$$

of the generalized Pauli operators on $k_{inner}$ qudits. Thus, this is a generalization of the odd codes in the qubit case. Due to (XIII.11), the transversal gate $\bar{S} = S^{\otimes n_{inner}}$ is a logical operator:

$$S^j X^k S^{-j} = \omega^{-jk(k+1)/2} Z^{jk} X^k \tag{XIII.15}$$

$$\bar{S}X(v)\bar{S}^{-1} = \omega^{-(v \cdot v + v \cdot \vec{1})/2} Z(v) X(v) \tag{XIII.16}$$

where, in the second equation, the phase factor vanishes when $v \in S$.

One can implement the measurement of the stabilizer $T^m X T^{-m}$ of the magic state $|\psi_m\rangle$ using the inner codes. The measurement becomes feasible if $C(T^m X T^{-m})$ can be implemented for logical qudits. Searching for its fault-tolerant implementation can begin by observing an identity $C(T^m X T^{-m}) = T^m (^C X) T^{-m}$ that enables one to implement some controlled Clifford on logical qudits. The actual action on logical qubits depends on the inner code, but conditions (XIII.11, XIII.12) will make it uniform across all logical qudits.

Recall $T^m X T^{-m} = \eta^{-1} S^m X$ where $\eta = 1$ if $p > 3$ and $\eta = e^{2\pi i/9}$ if $p = 3$. The action of the transversal gate $\bar{T}^m \bar{X} \bar{T}^{-m}$ can be deduced by looking at the logical operators and phase. The answer is $$\bar{T}^m \bar{X}\bar{T}^{-m} = \eta^{-n_{inner}} \bar{S}^m \bar{X} \cong \eta^{k_{inner}-n_{inner}} \prod_{a=1}^{k_{inner}} \eta^{-1}\left(\tilde{S}^{(a)}(\tilde{Z}^{(a)})^{1/2}\right)^m \tag{XIII.17}$$

because $$\begin{cases} \bar{S}^m \tilde{X}^{(a)} \bar{S}^{-m} = \omega^{-m/2}(\tilde{Z}^{(a)})^m \tilde{X}^{(a)} \\ \bar{S}^m \tilde{Z}^{(a)} \bar{S}^{-m} = \tilde{Z}^{(a)} \\ \bar{S}^m \underbrace{\sum_{v \in S} \frac{X(v)}{\sqrt{|S|}}|0\rangle^{\otimes n_{inner}}}_{|\tilde{0}\rangle^{\otimes k_{inner}}} = |\tilde{0}\rangle^{\otimes k_{inner}} \end{cases} \tag{XIII.18}$$

$$\begin{cases} (S^m Z^{m/2}) X (S^m Z^{m/2})^{-1} = \omega^{-m/2} Z^m X \\ (S^m Z^{m/2}) Z (S^m Z^{m/2})^{-1} = Z \\ (S^m Z^{m/2})|0\rangle = |0\rangle \end{cases}$$

Suppose $p > 3$. In order to implement $^C(\tilde{S}^m \tilde{X})$, one can consider an equation and a solution $$^C(S^m X) = (^C X^{1-y})(^C Z^z)(^C S^x)(^C X^y)(^C S^z)(^C Z^s)(^C \omega^t) \tag{XIII.19}$$

$$^C(S^m X) = (^C X^{1/3})[(^C Z^{3m/8})(^C S^{3m/4})](^C X^{2/3})[(^C S^{m/4}) (^C Z^{m/8})](^C \omega^{-m/6}) \tag{XIII.20}$$

where the control is common for every gate, and u,x,y,z,s,t are variables. (Using $^C A = \sum_j |j\rangle\langle j| \otimes A^j$, one can evaluate matrix elements on both sides.) Note that the operators in the brackets are powers of $^C(S^m Z^{m/2})$. This implies that indeed simultaneous $^C(\tilde{S}^m \tilde{X})$ on all logical qudits can be implemented using $T^m(^C \tilde{X}^{3m/4})T^{-m}$, $T^m(^C \tilde{X}^{m/4})T^{-m}$ controlled Pauli logical operators, and a power of Z on the control.

When $p = 3$ it suffices to consider $m = 1$. To remove the phase factor $\eta^{k_{inner}-n_{inner}}$ the $k_{inner}$ can be a multiple of 3. This can be achieved by considering three copies of a given code if necessary. $n_{inner}$ is already a multiple of 3 due to (XIII.11). One can implement $$\prod_{a=1}^{k_{inner}} {^C}\left(\eta^{-1} \tilde{S}^{(a)} \tilde{X}^{(a)}\right)$$

by an identity $$C(\eta^{-1} SX) = (^C X^{-1})(^C(\eta^{-1} SZ^{-1}))(^C Z)(^C X^{-1})(^C Z^{-1})(^C \omega^2). \tag{XIII.21}$$

It has been shown that it is possible to build a fault-tolerant routine to measure $T^m X T^{-m}$. One can show the existence of good qudit codes, so asymptotic properties remain the same as for the qubit case.

It is possible to generalize Lemma 4 to the case of matrices over a field $\mathbb{F}_p$ for $p > 2$; however, the generalization is more difficult since the self-orthogonality constraint implies a nonlinear constraint on the rows of the matrix so that each row is null; see Lemma 13. An alternative construction is now given that achieves the scaling similar to Lemma 6, namely that for any distance d, one can find a family of odd weakly self-dual qudit CSS codes with $X(\vec{1})$ in the stabilizer group such that the ratio $k_{inner}/n_{inner} \to 1$ as $n_{inner} \to \infty$. This construction is derived from Reed-Muller codes. Let $C = RM_{\mathbb{F}_p}(r,m)$ be a classical Reed-Muller code over $\mathbb{F}_p$; the codewords have length $p^m$. The dual code $C^\perp = RM_{\mathbb{F}_p}(m(p-1)-r-1, m)$; see Theorem 5.4.2 of Edvard F Assmus and Jennifer D Key. Designs and their Codes, 103 (Cambridge University Press, 1992). For any fixed r, for large enough m, $C \subset C^\perp$, so the codespace of C is self-orthogonal, and $\vec{1}$ is in the codespace of C. One can use the codespace of C as the space S, and use the CSS construction to define a weakly self-dual code. For fixed r, the rate of C tends to zero at large m, so the rate of the resulting weakly self-dual tends to 1. See S Vijay and L. Fu, "Quantum error correction for complex and majorana fermion qubits," 1703.00459 for weakly self-dual qubit codes derived from Reed-Muller codes. To make (XIII.12) hold, it may be necessary to use $S \oplus S$ instead of S.

C. Outer Codes

If the inner code has code distance d, then one should use an outer code with a parity check matrix that is $(d-1, \lceil \frac{d-1}{2} \rceil)$ – sensitive.

In full generality, one would want to use a parity check matrix with entries in $\mathbb{F}_p$, where an entry $\beta \neq 0$ would mean a stabilizer $(\eta^{-1}S^m X)^\beta$. This makes it necessary to have a different logical operator choice than used above.

However, a check matrix that is given by the adjacency matrix of a biregular graph with large girth is sufficient. Such a check matrix has only 0 and 1 entries, so no other choice of logical operator is necessary beyond what is given above. Recall that a graph with large girth is locally a tree. Hence, a bad magic state will be caught by many checks because it flips a single stabilizer in these checks, and the required sensitivity is guaranteed.

XIV. Symmetric Forms Over Finite Fields

The classified nondegenerate symmetric forms have been classified over the binary field $\mathbb{F}_2$ in Section V. Over a field of odd characteristic, the set of all finite dimensional vector spaces with nondegenerate symmetric forms (quadratic spaces for short) constitute an abelian group under the direct sum, after identifying hyperbolic planes as the identity. This group is known as the Witt group of the field, and the group structure is well known. Here a self-contained and elementary treatment of the Witt group of $\mathbb{F}_p$ is presented, and the quadratic spaces over fields of odd characteristic is classified.

It is natural to distinguish two cases depending on whether $-1 \in \mathbb{F}_p$ is a square, since a one-dimensional quadratic space is classified by $\mathbb{F}_p^\times/(\mathbb{F}_p^\times)^2$, where $\mathbb{F}_p^\times := \mathbb{F}_p \setminus \{0\}$ and $(\mathbb{F}_p^\times)^2 := \{x^2 \in \mathbb{F}^\times\}$. Since the multiplicative group $\mathbb{F}_p^\times$ is a cyclic group of order p-1, the element –1 being the unique element of $\mathbb{F}^\times$ with multiplicative order 2, is a square if and only if p=1 mod 4.

The part of the argument in Section V applies here without any change where any non-degenerate symmetric matrix was inductively converted to a direct sum of a diagonal matrix and blocks of $$\begin{pmatrix} 0 & 1 \\ 1 & 0 \end{pmatrix},$$

which represents a hyperbolic plane. Below, it is assumed that symmetric matrices are block diagonal in this form. It is then easy to explain why quadratic spaces constitute a group:

$$\begin{pmatrix} 1 & 1 \\ 1 & -1 \end{pmatrix}^T \begin{pmatrix} a & 0 \\ 0 & -a \end{pmatrix} \begin{pmatrix} 1 & 1 \\ 1 & -1 \end{pmatrix} = \begin{pmatrix} 0 & 2a \\ 2a & 0 \end{pmatrix} \cong \begin{pmatrix} 0 & 1 \\ 1 & 0 \end{pmatrix} \quad (XIV.1)$$

This means that the one-dimensional quadratic space with form (–a) is the inverse of the space with form (a). 2 is an invertible element of the field.

It is noted that the determinant of the symmetric form up to squares is a nontrivial invariant valued in the multiplicative group $\mathbb{F}_p^\times/(\mathbb{F}_p^\times)^2$ which is isomorphic to the additive group $\mathbb{Z}/2\mathbb{Z}$. Let $\alpha \in \mathbb{F}_p$ be a non-square.

Case I: p=1 mod 4 so that $-1 \in (\mathbb{F}_p^\times)^2$. Consider a block diag(a,a) of the symmetric matrix. Since –1 is a square, it can be seen diag(a,a)≅diag(a, –a)≅diag(1, –1)≅diag(1, 1) under congruent transformations. Therefore, there are four classes of symmetric matrices up to hyperbolic planes: diag(1), diag($\alpha$), diag(1, $\alpha$), and diag(1, 1). By looking at the determinant of the form and the parity of the dimension, it can be seen that the four classes are distinct elements of the Witt group, which is hence isomorphic to $\mathbb{Z}/2\mathbb{Z} \oplus \mathbb{Z}/2\mathbb{Z}$. Given a dimension of quadratic spaces, there are only two exclusive possibilities:

$$\text{diag}(1.1, \ldots, 1,1), \text{ and diag}(1.1, \ldots, 1,\alpha). \quad (XIV.2)$$

Case II: p=3 mod 4 so that $-1 \notin (\mathbb{F}_p^\times)^2$. In this case, one can set $\alpha = -1$. it is claimed that diag(1, 1) is not hyperbolic. If $v = av_1 + bv_2$ is a vector in this two-dimensional space, where $v_1$, $v_2$ are basis vectors with $v_i^2 = 1$ and a, b$\in \mathbb{F}_p$, then $v \cdot v = a^2 + b^2$. Since –1 is not a square, the equation $a^2 + b^2 = 0$ does not have any nonzero solution, and this proves the claim. Next, it is shown that diag(1, 1)≅diag(–1, –1). To this end, a solution to $a^2 + b^2 + 1 = 0$ over $\mathbb{F}_p$ is found. Once such a solution is found, then it can be seen that $$\begin{pmatrix} a & b \\ b & -a \end{pmatrix}^T \begin{pmatrix} 1 & 0 \\ 0 & 1 \end{pmatrix} \begin{pmatrix} a & b \\ b & -a \end{pmatrix} = \begin{pmatrix} -1 & 0 \\ 0 & -1 \end{pmatrix}. \quad (XIV.3)$$

The existence of the solution follows from $(\mathbb{F}_p^\times)^2 + (\mathbb{F}_p^\times)^2 \not\subseteq (\mathbb{F}_p^\times)^2$, which implies that $(\mathbb{F}_p^\times)^2 + (\mathbb{F}_p^\times)^2 \ni -1$. If $(\mathbb{F}_p^\times)^2 + (\mathbb{F}_p^\times)^2 \subseteq (\mathbb{F}_p^\times)^2$, then $(\mathbb{F}_p^\times)^2$ would be a monoid under addition contained in a finite group, and hence would be a group itself, which must contain $0 \notin (\mathbb{F}_p^\times)^2$. Therefore, quadratic spaces given a dimension are classified by the determinant of the form up to squares.

$$\text{diag}(1,1, \ldots 1,1), \text{ and diag}(1, \ldots 1,-1) \quad (XIV.4)$$

The Witt group of $\mathbb{F}_p$ is isomorphic to $\mathbb{Z}/4\mathbb{Z}$ generated by diag(1).

Now, certain facts and proofs are provided about quadratic spaces.

Lemma 10 (Chapter XV Theorem 10.2 of Serge Lang, Algebra, revised 3rd ed. (Springer, 2002).). Let Q be a nondegenerate quadratic space. If two subspaces V and U are isomorphic by an isometry $\sigma: V \to U$, then there exists an isometry $\bar\sigma: Q \to Q$ such that $\bar\sigma|_V = \sigma$.

Lemma 11. Let N be a null subspace (on which the symmetric form vanishes) of a nondegenerate quadratic space Q over $\mathbb{F}_p$. Then, Q is isometric to the orthogonal sum of $N^\perp/N$ and a minimal hyperbolic subspace that contains N.

Proof. Applying Lemma 10 to the identity map a, one can conclude that any orthogonal set of vectors extends to an orthogonal basis. Since the form is nondegenerate, there exists a minimal hyperbolic subspace that includes N (hyperbolic extension), and the symmetric form can be written as $\Lambda' \oplus \lambda$. where $\lambda$ is hyperbolic, and $\Lambda'$ is nondegenerate. It is then clear that $N^\perp/N$ has the symmetric form $\Lambda'$. □

Lemma 12. Let Q be a nondegenerate quadratic space of dimension n over $\mathbb{F}_p$. Every maximal null subspace of Q has the same dimension in. Given any null subspace N of dimension k≤m, the number of null vectors of Q that are orthogonal to N is $$\#\mathcal{Z}(Q,N) = p^{n-k-1} + p^m - p^{n-m-1} =: \zeta(n,m,k). \quad (XIV.5)$$

Proof. To prove the first claim, suppose M, M' are maximal null subspaces. If dim M≤dim M', then any injection from M to M' is an isometry, which can be extended to Q as $\bar\sigma$. Then, $\bar\sigma^{-1}(M')$ is a null superset of M, and hence is M itself since M is maximal. Thus, dim M=dim M'.

Let $\mathcal{Z}$ (Q, N) be the set of all null vectors of Q that are orthogonal to N. ($\mathcal{Z}$ is not a subspace in general.) Consider $\phi$: $\mathcal{Z}$ (Q,N) $\to$ $\mathcal{Z}$ (N$^\perp$/N,0), a restriction of the canonical projection map Q$\to$Q/N. The map $\phi$ is subjective by definition of $\zeta$. If x, y$\in \mathcal{Z}$ (Q,N) are mapped to the same element, then x−y$\in$N. This implies that $\phi$ maps exactly #N elements to one. (Here, # denotes the number of elements of the finite set.) Therefore, $$\# \mathcal{Z} (Q,N) = (\#N)(\# \mathcal{Z} (N^\perp/N,0)). \tag{XIV.6}$$

Due to the preceding lemma, the dimension of a maximal null subspace of N$^\perp$/N is m−k. Thus, it remains only to prove the lemma when k=0 since $$\# \mathcal{Z} (Q,k) = p^k(p^{n-2k-1} - p^{n-k-1} + p^{m-k}) = p^{n-k-1} - p^{n-m-1} + p^m. \tag{XIV.7}$$

A definite quadratic space is one in which w·w=0 implies w=0. (A definite space corresponds to a nontrivial element of the Witt group; for example, a one-dimensional space is always definite; If $\alpha$ is not a square, then the symmetric form diag(1, −$\alpha$) is definite.) To count all null vectors, one can work in a basis such that the n-by-n symmetric matrix is $$\Lambda = \Lambda' \oplus \Lambda_{2m} \tag{XIV.8}$$

where $\Lambda'$ definite, and $$\Lambda_{2m} = \frac{1}{2} \begin{pmatrix} 0 & 1 \\ 1 & 0 \end{pmatrix} \otimes I_m$$

is an orthogonal sum of m hyperbolic planes. In this basis, let one write any vector x as x'$\oplus$(u, u'). The nullity is then expressed by a quadratic equation of coordinates $$x'\cdot x' + u\cdot u' = 0. \tag{XIV.9}$$

The solutions of this equation are divided into two classes: x'·x'=0 or x'·x'$\neq$0. In the former case, x'=0 and u·u'=0. Given arbitrary u there is u' such that this equation holds. The number of solutions is $p^m + (p^m-1)p^{m-1}$. In the latter case, one has u$\neq$0, and u·u'=c=−x'·x'$\neq$0 is a inhomogeneous equation in u', whose solution always exists. For any given nonzero c, there are thus $(p^m-1)p^{m-1}$ choices of (u, u'). x' can be any nonzero vector, so there are $p^{n-2m}-1$ choices. In sum, the number of null vectors in an n-dimensional quadratic space Q over $\mathcal{Z}_p$ is $$\# \mathcal{Z} (Q,0) = p^m + (p^m-1)p^{m-1} + (p^{n-2m}-1)(p^m-1)p^{m-1} = p^{n-1} - p^{n-m-1} + p^m. \tag{XIV.10}$$

□

Lemma 13. Let $w_\perp = \vec{1} \in \mathbb{F}_p^n$ be the all-1 vector where n is a multiple of p$\geq$3. Assume c<(n−2)/2, and let $w_2, \ldots, w_c$ be null vectors of $\mathbb{F}_p^n$ chosen inductively such that $w_j$ is chosen uniformly at random from $\mathcal{Z}$ ($\mathbb{F}_p^n$, $V_{j-1}$) where $V_{j-1}$=span($w_1, \ldots, w_{j-1}$). Let M be a c-by-n matrix M with rows $w_j$.

Consider a fixed n-component vector v, with v$\neq$0 and v$\neq \vec{1}$. The probability that Mv=0 is bounded from above by $$20 \left(\frac{3}{5}\right)^{n-c} + \left(\frac{11}{15}\right)^{c-1}. \tag{XIV.11}$$

Proof. The desired probability is estimated by a union bound, considering separately the event that v$\in V_c^\perp$ and v$\notin V_c$, and the event that v$\in V_c^\perp$ and v$\in V_c$. The second event is possible only if v·v=0. By the classification of symmetric forms, a maximal null space of $\mathbb{F}_p^n$ has dimension m such that n−2$\leq$2m$\leq$n. The assumption that c<(n−2)/2 implies that $$k_j := \dim V_j \leq j \leq c \leq m-1. \tag{XIV.12}$$

Consider the first event, assuming v·v=0. Let j>1. Then $$Pr[v \in V_j^\perp \text{ and } v \notin V_j \mid v \in V_{j-1}^\perp \setminus V_{j-1}] \leq \tag{XIV.13}$$

$$\frac{\zeta(n, m, k_{j-1}+1)}{\zeta(n, m, k_{j-1})} \leq \frac{p}{2p-1} \leq \frac{3}{5}$$

because $w_j$ has to be orthogonal to span(v)+$V_{j-1}$, which is null and is a proper superset of $V_{j-1}$. Thus, for any t, $$Pr[v \in V_t^\perp \text{ and } v \notin V_t] = \tag{XIV.14}$$

$$Pr[v \in V_1^\perp \setminus V_1] \prod_{j=2}^{t} Pr[v \in V_j^\perp \setminus V_j \mid v \in V_{j-1}^\perp \setminus V_{j-1}] \leq$$

$$\prod_{j=2}^{t} \frac{\zeta(n, m, k_{j-1}+1)}{\zeta(n, m, k_{j-1})} \leq \left(\frac{3}{5}\right)^{t-1}.$$

For t=c, one finds in particular that $$Pr[v \in V_c^\perp \text{ and } v \notin V_c] \leq (3/5)^{c-1}. \tag{XIV.15}$$

Now assume v·v$\neq$0. The event that v$\in V_j^\perp$ happens only if $w_j$ is chosen from v$^\perp$. The decomposition is bound as follows:

$$Pr[v \in V_c^\perp] = Pr[v \in V_1^\perp] \prod_{j=2}^{c} Pr[v \in V_j^\perp \mid v \in V_{j-1}^\perp].$$

The first term is bounded by 1 trivially. For other factors, it is observed that the dimension of v$^\perp$ is n−1, and a maximal null subspace in v$^\perp$ has dimension m'$\leq$m. Under the conditioning v$\in V_{j-1}^\perp$, the null space $V_{j-1}$ is a subspace of v$^\perp$, and # $\mathcal{Z}$ (v$^\perp$, $V_{j-1}$)=$\zeta$(n−1, m', k$^{j-1}$)$\leq\zeta$(n−1, m, k$_{j-1}$). Hence, $$Pr[v \in V_c^\perp] = Pr[v \in V_1^\perp] \prod_{j=2}^{c} Pr[v \in V_j^\perp \mid v \in V_{j-1}^\perp] \leq \tag{XIV.16}$$

$$\prod_{j=2}^{c} \frac{\zeta(n-1, m, k_{j-1})}{\zeta(n, m, k_{j-1})} \leq \left(\frac{p^2+p-1}{2p^2-p}\right)^{c-1} \leq \left(\frac{11}{15}\right)^{c-1}$$

where in the second inequality, the assumption that $k_{j-1} \leq c <$ (n−2)/2$\leq$m was used.

Turn now to the second event and assume v·v=0. Note that if v$\in V_c$, there is a least j such that v$\in V_j$. So, $$Pr[v \in V_c^\perp \text{ and } v \in V_c] \leq \tag{XIV.17}$$

$$\prod_{j=2}^{c} Pr[v \in V_j \text{ and } v \in V_{j-1}^\perp \text{ and } v \notin V_{j-1}].$$

One has $$Pr[v \in V_j \text{ and } v \in V_{j-1}^\perp \text{ and } v \notin V_{j-1}] = \tag{XIV.18}$$

$$Pr[v \in V_{j-1}^\perp \text{ and } v \notin V_{j-1}].$$

-continued
$$Pr[v \in V_j | v \in V_{j-1}^\perp \text{ and } v \notin V_{j-1}] \le$$
$$\left(\frac{3}{5}\right)^{j-2} Pr[v \in V_{j-1}^\perp \text{ and } v \notin V_{j-1}],$$

where Eq. (XIV.14) was used. The second factor is bounded as $$Pr[v \in V_j | v \in V_{j-1}^\perp \text{ and } v \notin V_{j-1}] \le \frac{p^{1+k_{j-1}}}{\zeta(n, m, k_{j-1})} < \frac{3}{2p^{n-2j}} \quad \text{(XIV.19)}$$

because $w_j$ belongs to span(v)+$V_{j-1}$. Hence, Pr[$v \in V_j$ and $v \in V_{j-1}^\perp$ and $v \notin V_{j-1}$]≤5(⅗)$^{n-j}$. So by Eq. (XIV.17), $$Pr[v \in V_c^\perp \text{ and } v \in V_c] \le \sum_{j=2}^{c} 5\left(\frac{3}{5}\right)^{n-j} < 20\left(\frac{3}{5}\right)^{n-c}. \quad \text{(XIV.20)}$$

Summing the probabilities of (XIV.16) and (XIV.20), the proof is complete. □

XV. Example Computing Environments

FIG. 1 illustrates a generalized example of a suitable computing environment 100 in which several of the described embodiments can be implemented. The computing environment 100 is not intended to suggest any limitation as to the scope of use or functionality of the disclosed technology, as the techniques and tools described herein can be implemented in diverse general-purpose or special-purpose environments that have computing hardware.

With reference to FIG. 1, the computing environment 100 includes at least one processing device 110 and memory 120. In FIG. 1, this most basic configuration 130 is included within a dashed line. The processing device 110 (e.g., a CPU or microprocessor) executes computer-executable instructions. In a multi-processing system, multiple processing devices execute computer-executable instructions to increase processing power. The memory 120 may be volatile memory (e.g., registers, cache. RAM, DRAM, SRAM), non-volatile memory (e.g., ROM, EEPROM, flash memory), or some combination of the two. The memory 120 stores software 180 implementing tools for implementing the quantum circuit (e.g., the Magic state distillation circuits and associated techniques) as described herein.

The computing environment can have additional features. For example, the computing environment 100) includes storage 140, one or more input devices 150, one or more output devices 160, and one or more communication connections 170. An interconnection mechanism (not shown), such as a bus, controller, or network, interconnects the components of the computing environment 100. Typically, operating system software (not shown) provides an operating environment for other software executing in the computing environment 100, and coordinates activities of the components of the computing environment 100.

The storage 140 can be removable or non-removable, and includes one or more magnetic disks (e.g., hard drives), solid state drives (e.g., flash drives), magnetic tapes or cassettes, CD-ROMs, DVDs, or any other tangible non-volatile storage medium which can be used to store information and which can be accessed within the computing environment 100. The storage 140 can also store instructions for the software 180 implementing the quantum circuits and techniques described herein.

The input device(s) 150 can be a touch input device such as a keyboard, touchscreen, mouse, pen, trackball, a voice input, device, a scanning device, or another device that provides input to the computing environment 100. The output device(s) 160 can be a display device (e.g., a computer monitor, laptop display, smartphone display, tablet display, netbook display, or touchscreen), printer, speaker, or another device that provides output from the computing environment 100.

The communication connection(s) 170 enable communication over a communication medium to another computing entity. The communication medium conveys information such as computer-executable instructions or other data in a modulated data signal. A modulated data signal is a signal that has one or more of its characteristics set or changed in such a manner as to encode information in the signal. By way of example, and not limitation, communication media include wired or wireless techniques implemented with an electrical, optical, RF, infrared, acoustic, or other carrier.

As noted, the various methods for generating the disclosed circuits (e.g., for compiling/synthesizing the circuits) can be described in the general context of computer-readable instructions stored on one or more computer-readable media. Computer-readable media are any available media (e.g., memory or storage device) that can be accessed within or by a computing environment. Computer-readable media include tangible computer-readable memory or storage devices, such as memory 120 and/or storage 140, and do not include propagating carrier waves or signals per se (tangible computer-readable memory or storage devices do not include propagating carrier waves or signals per se).

Various embodiments of the methods disclosed herein can also be described in the general context of computer-executable instructions (such as those included in program modules) being executed in a computing environment by a processor. Generally, program modules include routines, programs, libraries, objects, classes, components, data structures, and so on, that perform particular tasks or implement particular abstract data types. The functionality of the program modules may be combined or split between program modules as desired in various embodiments. Computer-executable instructions for program modules may be executed within a local or distributed computing environment.

Figure 2:
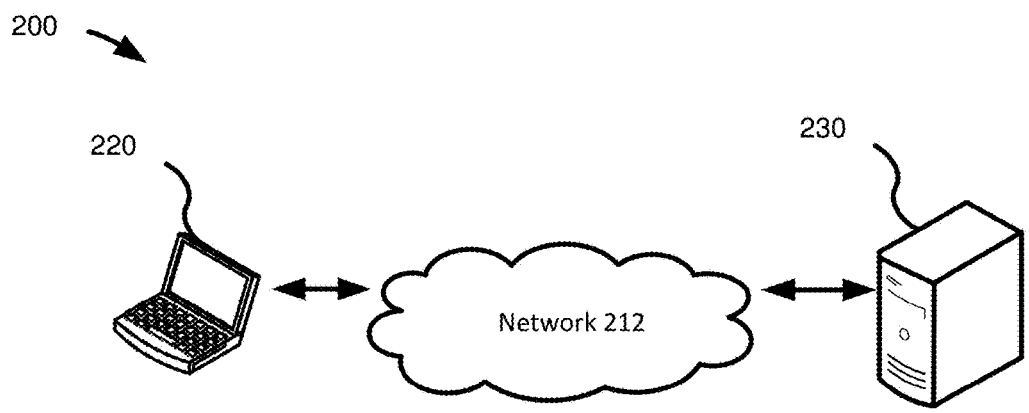
FIG. 2 shows an example of a possible network topology (e.g., a client-server network) for implementing a system according to the disclosed technology.

An example of a possible network topology 200 (e.g., a client-server network) for implementing a system according to the disclosed technology is depicted in FIG. 2. Networked computing device 220 can be, for example, a computer running a browser or other software connected to a network 212. The computing device 220 can have a computer architecture as shown in FIG. 1 and discussed above. The computing device 220 is not limited to a traditional personal computer but can comprise other computing hardware configured to connect to and communicate with a network 212 (e.g., smart phones, laptop computers, tablet computers, or other mobile computing devices, servers, network devices, dedicated devices, and the like). In the illustrated embodiment, the computing device 220 is configured to communicate with a computing device 230 (e.g., a remote server, such as a server in a cloud computing environment) via a network 212. In the illustrated embodiment, the computing device 220 is configured to transmit input data to the computing device 230, and the computing device 230 is configured to implement any of the quantum circuits disclosed herein (e.g., compiling/synthesizing the quantum circuit from a higher-level circuit description) and outputting results to the computing device 220. Any of the data received from the computing device 2930 can be stored or displayed on the computing device 2920 (e.g., displayed as data on a graphical user interface or web page at the computing devices 220). In the illustrated embodiment, the illustrated network 212 can be implemented as a Local Area Network (LAN) using wired networking (e.g., the Ethernet IEEE standard 802.3 or other appropriate standard) or wireless networking (e.g. one of the IEEE standards 802.11a, 802.11b, 802.11g, or 802.11n or other appropriate standard). Alternatively, at least part of the network 212 can be the Internet or a similar public network and operate using an appropriate protocol (e.g., the HTTP protocol).

Figure 3:
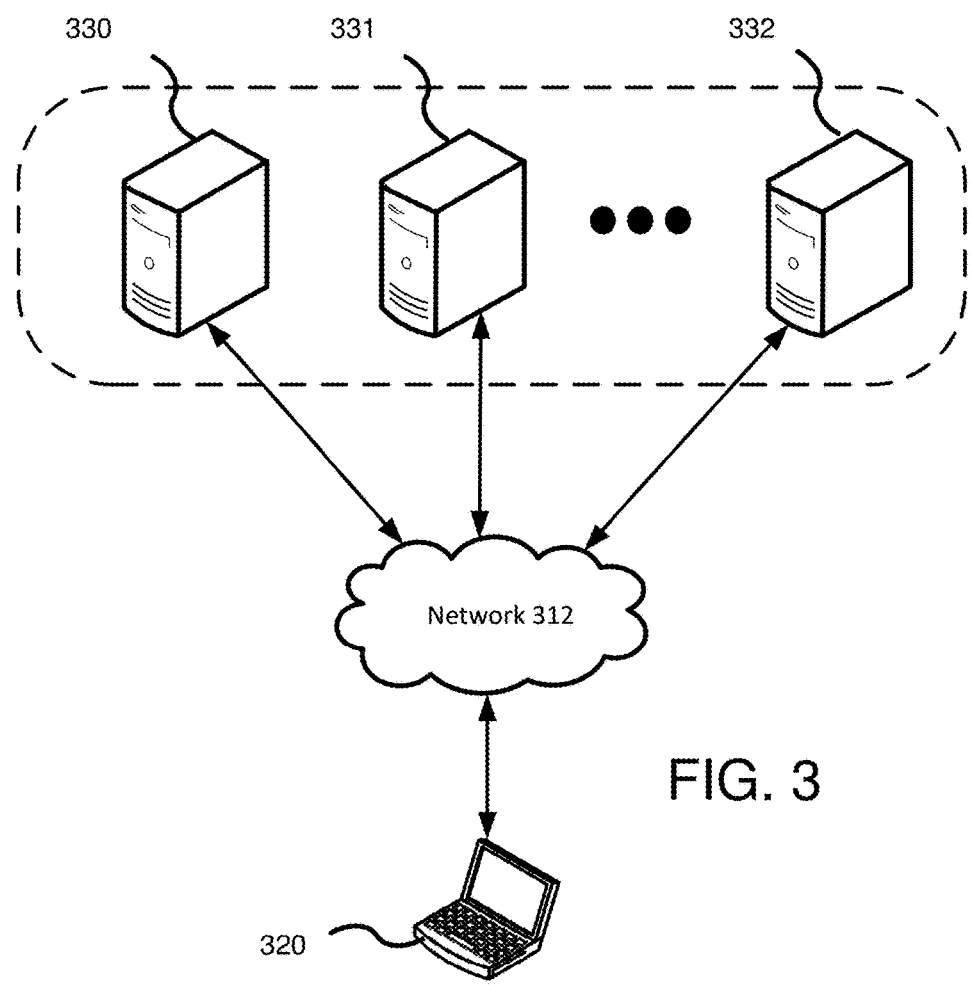
FIG. 3 shows another example of a possible network topology (e.g., a distributed computing environment) for implementing a system according to the disclosed technology.

Another example of a possible network topology 300 (e.g., a distributed computing environment) for implementing a system according to the disclosed technology is depicted in FIG. 3. Networked computing device 320 can be, for example, a computer running a browser or other software connected to a network 312. The computing device 320 can have a computer architecture as shown in FIG. 1 and discussed above. In the illustrated embodiment, the computing device 320 is configured to communicate with multiple computing devices 330, 331, 332 (e.g., remote servers or other distributed computing devices, such as one or more servers in a cloud computing environment) via the network 312. In the illustrated embodiment, each of the computing devices 330, 331, 332 in the computing environment 300 is used to perform at least a portion of any of the quantum circuits disclosed herein. In other words, the computing devices 330, 331, 332 form a distributed computing environment in which the quantum circuit implementation process is shared across multiple computing devices. The computing device 320 is configured to transmit input data to the computing devices 330, 331, 332, which are configured to distributively implement any of the quantum circuit processes disclosed herein (e.g., compiling/synthesizing the quantum circuit from a higher-level circuit description) and to provide results to the computing device 320. Any of the data received from the computing devices 330, 331, 332 can be stored or displayed on the computing device 320 (e.g., displayed as data on a graphical user interface or web page at, the computing devices 320). The illustrated network 312 can be any of the networks discussed above with respect to FIG. 2.

Figure 4:
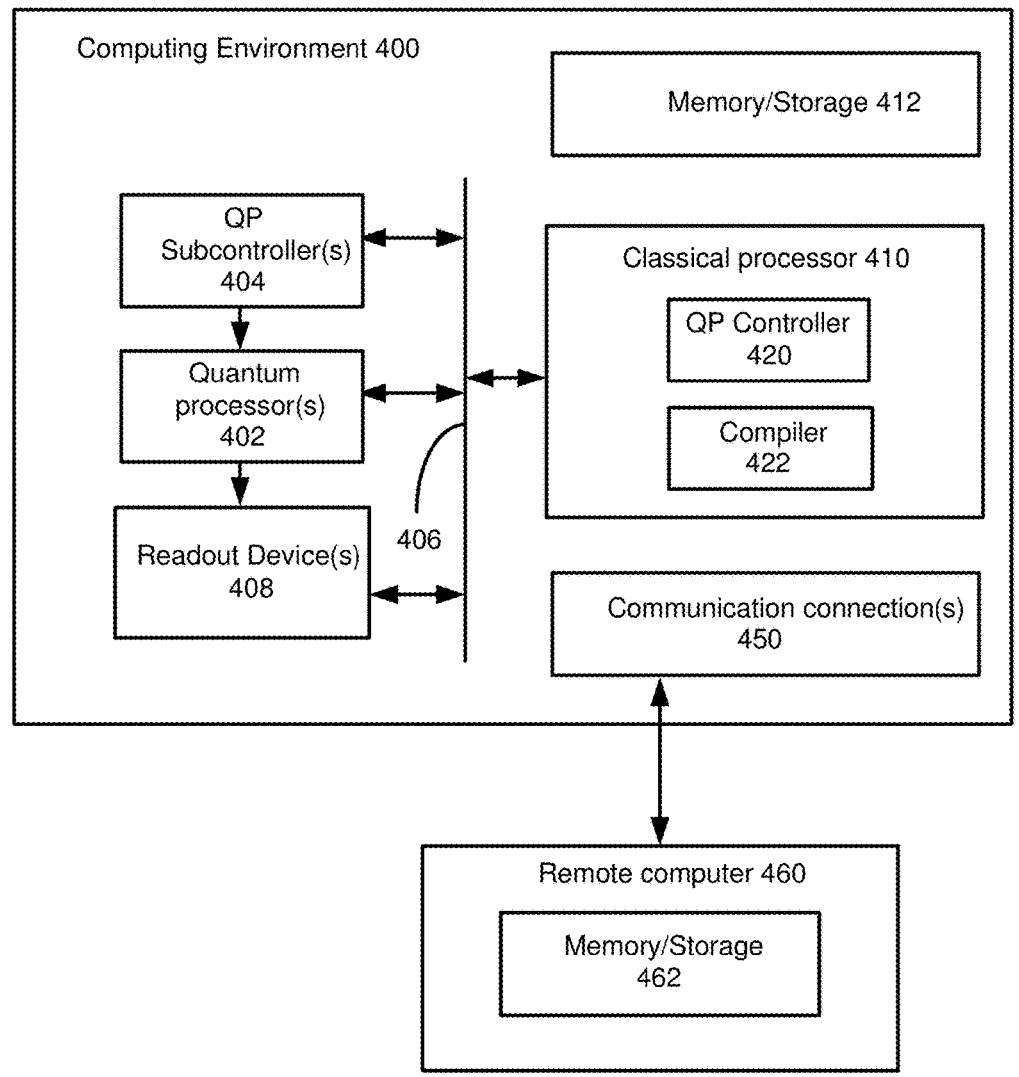
FIG. 4 shows an exemplary system for implementing embodiments of the disclosed technology.

With reference to FIG. 4, an exemplary system for implementing embodiments of the disclosed technology includes computing environment 400. In computing environment 400, a compiled quantum computer circuit description, including a circuit description for one or more magic state distillation circuits as disclosed herein, can be used to program (or configure) one or more quantum processing units such that the quantum processing unit(s) implement the circuit described by the quantum computer circuit description. The quantum computer circuit description can implement any of the magic state distillation circuits discussed herein.

The environment 400 includes one or more quantum processing units 402 and one or more readout device(s) 408. The quantum processing unit(s) execute quantum circuits that are precompiled and described by the quantum computer circuit description. The quantum processing unit(s) can be one or more of, but are not limited to: (a) a superconducting quantum computer; (b) an ion trap quantum computer; (c) a fault-tolerant architecture for quantum computing; and/or (d) a topological quantum architecture (e.g., a topological quantum computing device using Majorana zero modes). The precompiled quantum circuits, including any of the disclosed circuits, can be sent into (or otherwise applied to) the quantum processing unit(s) via control lines 406 at the control of quantum processor controller 420. The quantum processor controller (QP controller) 420 can operate in conjunction with a classical processor 410 (e.g., having an architecture as described above with respect to FIG. 1) to implement the desired quantum computing process. Further, the classical processor 410 can be programmed to implement any of the disclosed methods.

In the illustrated example, the QP controller 420 further implements the desired quantum computing process via one or more QP subcontrollers 404 that are specially adapted to control a corresponding one of the quantum processor(s) 402. For instance, in one example, the quantum controller 420 facilitates implementation of the compiled quantum circuit by sending instructions to one or more memories (e.g., lower-temperature memories), which then pass the instructions to low-temperature control unit(s) (e.g., QP subcontroller(s) 404) that transmit, for instance, pulse sequences representing the gates to the quantum processing unit(s) 402 for implementation. In other examples, the QP controller(s) 420 and QP subcontroller(s) 404 operate to provide appropriate magnetic fields, encoded operations, or other such control signals to the quantum processor(s) to implement the operations of the compiled quantum computer circuit description. The quantum controller(s) can further interact with readout devices 408 to help control and implement the desired quantum computing process (e.g., by reading or measuring out data results from the quantum processing units once available, etc.)

With reference to FIG. 4, compilation is the process of translating a high-level description of a quantum algorithm into a quantum computer circuit description comprising a sequence of quantum operations or gates, which can include any of the magic state distillation circuits as disclosed herein. The compilation can be performed by a compiler 422 using a classical processor 410 (e.g., as shown in FIG. 1) of the environment 400 which loads the high-level description from memory or storage devices 412 and stores the resulting quantum computer circuit description in the memory or storage devices 412.

In other embodiments, compilation can be performed remotely by a remote computer 400 (e.g., a computer having a computing environment as described above with respect to FIG. 1) which stores the resulting quantum computer circuit description in one or more memory or storage devices 462 and transmits the quantum computer circuit description to the computing environment 400 for implementation in the quantum processing unit(s) 402. Still further, the remote computer 400 can store the high-level description in the memory or storage devices 462 and transmit the high-level description to the computing environment 400 for compilation and use with the quantum processor(s). In any of these scenarios, results from the computation performed by the quantum processor(s) can be communicated to the remote computer after and/or during the computation process. Still further, the remote computer can communicate with the QP controller(s) 420 such that the quantum computing process (including any compilation and/or QP processor control procedures) can be remotely controlled by the remote computer 460. In general, the remote computer 460 communicates with the QP controller(s) 420 and/or compiler/synthesizer 422 via communication connections 450.

In particular embodiments, the environment 400 can be a cloud computing environment, which provides the quantum processing resources of the environment 400 to one or more remote computers (such as remote computer 460) over a suitable network (which can include the internet).

XVI. General Embodiments

This section describes several example embodiments for implementing embodiments of the disclosed technology. The disclosed tools and techniques are not to be construed as limiting in any way, as an one or more of the illustrated method acts can be performed alone or in various other combinations and subcombinations with one another. Further, any one or more of the disclosed method acts can be performed with one or more other method acts disclosed herein.

Figure 10:
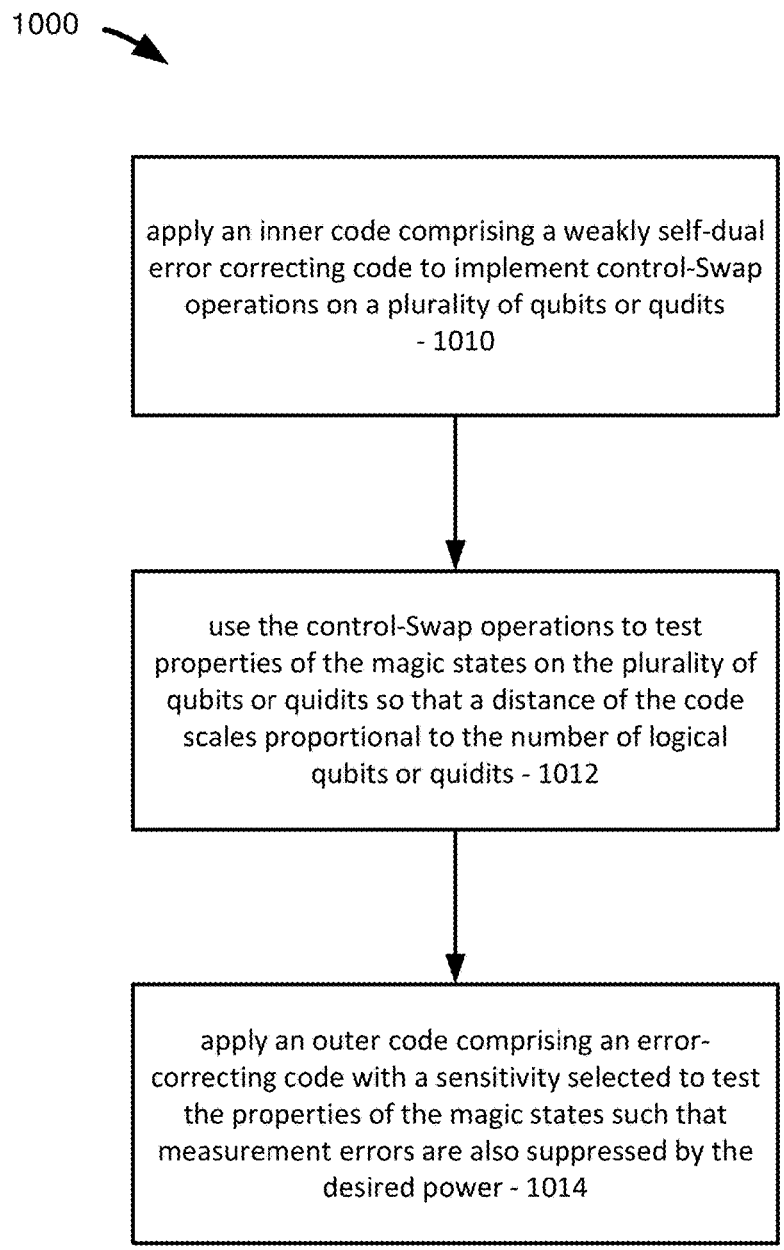
FIG. 10 is a flowchart of an example method for distilling magic states in a quantum computing device in accordance with embodiments of the disclosed technology.

FIG. 10 is a flowchart of an example method 1000 for distilling magic states in a quantum computing device in accordance with embodiments of the disclosed technology. The illustrated embodiment should not be construed as limiting, as the disclosed method acts can, in some cases, be performed alone, in different orders, or at least partially simultaneously with one another. Further, any of the disclosed methods or method acts can be performed with any other methods or method acts disclosed herein.

In some embodiments, the methods below are performed (at least in part) by a classical computer configured to communicate with and control a quantum computer. Still further, the method acts can be embodied as computer-executable instructions which when executed by a computer cause the computer to perform the methods.

At 1010, an inner code is applied (e.g., to qubits or qudits in a quantum computing device). In the illustrated embodiment, the inner code comprises a weakly self-dual error correcting code to implement control-Swap operations on the plurality of qubits or qudits.

At 1012, the control-Swap operations are used to test properties of the magic states on the plurality of qubits or quidits so that a distance of the code scales proportional to the number of logical qubits or quidits.

In some embodiments, the method suppresses errors exhibited by magic states by a power (e.g., a selected or chosen target power). For example, at 1014, an outer code is applied (e.g., to the qubits or qudits in the quantum computing device). In the illustrated embodiment, the outer code comprises an error-correcting code with a sensitivity selected to test the properties of the magic states such that measurement errors are also suppressed by the power. The power can, for example, be selected or chosen by a designer of the quantum circuit and can choose the power based on a variety of factors, including the size of the quantum circuit to be implemented, the desired accuracy of the result to be produced by the circuit, and the available quantum circuit overhead to implement the error-correcting code.

In some embodiments, the inner code uses 16 physical qubits, obtains 6 logical qubits, and has a code distance of 4. In certain embodiments, the inner code uses 30 physical qubits, obtains 6 logical qubits, and has a code distance of 6. In some embodiments, the inner code uses 64 physical qubits, obtains 12 logical qubits, and has a code distance of 8.

In further embodiments, the magic states are implemented by T-gates. In some embodiments, the quantum computing device is a topological quantum computer. In certain embodiments, the error correcting codes are Calderbank-Shor-Steane codes that implement controlled Hadanmards for the inner code and reduce circuit depth. In some embodiments, the inner code and the outer code are implemented by a single concatenated circuit (e.g., implemented by the quantum computing device and configured to communicate with/control the plurality of qubits or qudits).

In some embodiments, at least two of the magic states are input at different stages from one another.

In certain embodiments, the inner code implements controlled-Hadamard operations, and the number of physical qubits or qudits used is odd. For example, in certain implementations, the inner code uses 17 physical qubits, obtains 1 logical qubits, and has a code distance of 5. In other implementations, the inner code uses 21 physical qubits, obtains 3 logical qubits, and has a code distance of 5.

Relatedly, circuits configured to distill magic states in a quantum computing device (e.g., circuits operating within or in concert with the quantum computing device) are also disclosed. Some embodiments comprise: quantum circuit elements configured to implement an inner code and an outer code, the inner code providing a weakly self-dual error correcting code to implement control-Swap operations on a plurality of logical qubits or qudits and provide error suppression to a target power (e.g., a selected or chosen power), the outer code providing an error-correcting code with a sensitivity selected to test the properties of the magic states such that measurement errors are also suppressed by the target power. The target power can, for example, be selected or chosen by a designer of the quantum circuit and can choose the power based on a variety of factors, including the size of the quantum circuit to be implemented, the desired accuracy of the result to be produced by the circuit, and the available quantum circuit overhead to implement the error-correcting code.

In some embodiments, the inner code uses 16 physical qubits, obtains 6 logical qubits, and has a code distance of 4. In further embodiments, the inner code uses 30 physical qubits, obtains 6 logical qubits, and has a code distance of 6. In some embodiments, the inner code uses 64 physical qubits, obtains 12 logical qubits, and has a code distance of 8.

In certain embodiments, the circuit comprises a plurality of T-gates configured to implement the magic states. In some embodiments, the circuit is part of a topologically protected quantum computer using Majorana zero modes to implement qubits or qudits.

In further embodiments, the error correcting codes are Calderbank-Shor-Steane codes that implement controlled Hadamards for the inner code and reduce circuit depth. In some embodiments, the circuit is concatenation-free. In certain embodiments, the circuit is configured to input at least two of the magic states at different circuit stages from one another.

In some embodiments, the inner code implements controlled-Hadamnard operations, and the number of physical qubits or qudits used is odd. For example, the inner code uses 17 physical qubits, obtains 1 logical qubits, and has a code distance of 5. In other examples, the inner code uses 21 physical qubits, obtains 3 logical qubits, and has a code distance of 5.

In further embodiments, the outer code gives seventh order reduction in error when used with an inner code of distance 7 or more. And, in some implementations, the outer code is obtained from a Tanner graph of girth 6 or more and the outer code has distance 7 or more. Such outer codes may have each qubit participating in exactly 3 checks or may have a small number of additional checks to give the needed distance with a smaller code.

FIG. 11 is a flowchart of an example method 1100 for distilling magic states in a quantum computing device in accordance with embodiments of the disclosed technology. The illustrated embodiment should not be construed as limiting, as the disclosed method acts can, in some cases, be performed alone, in different orders, or at least partially simultaneously with one another. Further, any of the disclosed methods or method acts can be performed with any other methods or method acts disclosed herein.

In some embodiments, the methods below are performed (at least in part) by a classical computer configured to communicate with and control a quantum computer. Still further, the method acts can be embodied as computer-executable instructions which when executed by a computer cause the computer to perform the methods.

At 1110, applying an inner code and outer code to distill a plurality of the magic states in the quantum computing device, and thereby possible error in the magic states. In the illustrated embodiment, the inner code comprises Bose-Chaudhuri-Hocquenghem ("BCH") codes to implement operations on a plurality of physical qubits or quidits in the quantum computing device.

In some embodiments, the outer codes are determined by arranging the qubits or qudits in a two dimensional or three dimensional code. In certain embodiments, the inner code further comprises error correcting codes.

Relatedly, circuits configured to distill magic states in a quantum computing device (e.g., circuits operating within or in concert, with the quantum computing device) are also disclosed. Some embodiments comprise: quantum circuit elements configured to implement an inner code and an outer code for suppressing error in physical qubits or qubits that implement the magic states, the quantum circuit elements for the inner code being configured to apply Bose-Chaudhuri-Hocquenghem ("BCH") codes on one or more of the physical qubits or quidits of the quantum computing device.

In some embodiments, the outer codes are determined by representing the qubits or qudits as arranged in a two dimensional or three dimensional grid. In certain embodiments, the circuit is further configured to perform an error correction procedure if the inner code detects an error syndrome that can be caused by a small number of errors (e.g., one or two errors).

XVII. CONCLUDING REMARKS

Having described and illustrated the principles of the disclosed technology with reference to the illustrated embodiments, it will be recognized that the illustrated embodiments can be modified in arrangement and detail without departing from such principles.

What is claimed is:

1. A method for distilling magic states in a topological quantum computing device, comprising:
   in the topological quantum computing device:
      applying an inner code comprising a weakly self-dual error correcting code to implement control-Swap operations on a plurality of qubits or qudits; and
      using the control-Swap operations to test properties of the magic states on the plurality of qubits or qudit so that a distance of the code scales proportional to the number of logical qubits or qudits,
      wherein the topological quantum computing device uses Majorana zero modes to implement the plurality of qubits or qudits.

2. The method of claim 1, wherein the method suppresses errors exhibited by magic sates by a power, and wherein the method further comprises applying an outer code comprising an error-correcting code with a sensitivity selected to test the properties of the magic states such that measurement errors are also suppressed by the power.

3. The method of claim 1, wherein the inner code (a) uses 16 physical qubits, obtains 6 logical qubits, and has a code distance of 4; (b) uses 30 physical qubits, obtains 6 logical qubits, and has a code distance of 6; or (c) uses 64 physical qubits, obtains 12 logical qubits, and has a code distance of 8.

4. The method of claim 1, wherein the magic states are implemented by T-gates.

5. The method of claim 1, wherein the error correcting codes are Calderbank-Shor-Steane codes that implement controlled Hadamards for the inner code and reduce circuit depth.

6. The method of claim 1, wherein at least two of the magic states are input at different stages from one another.

7. The method of claim 1, wherein the inner code implements controlled-Hadamard operations, and the number of physical qubits or qudits used is odd.

8. The method of claim 7, wherein (a) the inner code uses 17 physical qubits, obtains 1 logical qubits, and has a code distance of 5; or (b) the inner code uses 21 physical qubits, obtains 3 logical qubits, and has a code distance of 5.

9. A circuit configured to distill magic states in a quantum computing device, comprising:
   quantum circuit elements configured to implement an inner code and an outer code, the inner code providing a weakly self-dual error correcting code to implement control-Swap operations on a plurality of logical qubits or qudits and provide error suppression to a target power,
   the outer code providing an error-correcting code with a sensitivity selected to test the properties of the magic states such that measurement errors are also suppressed by the target power,
   wherein the circuit is part of a topologically protected quantum computer using Majorana zero modes to implement qubits or qudits.

10. The circuit of claim 9, wherein the inner code uses: (a) 16 physical qubits, obtains 6 logical qubits, and has a code distance of 4; (b) 30 physical qubits, obtains 6 logical qubits, and has a code distance of 6; or (c) 64 physical qubits, obtains 12 logical qubits, and has a code distance of 8.

11. The circuit of claim 9, further comprising a plurality of T-gates configured to implement the magic states.

12. The circuit of claim 9, wherein the error correcting codes are Calderbank-Shor-Steane codes that implement controlled Hadamards for the inner code and reduce circuit depth.

13. The circuit of claim 9, wherein the circuit is concatenation-free.

14. The circuit of claim 9, wherein the circuit is configured to input at least two of the magic states at different circuit stages from one another.

15. The circuit of claim 9, wherein the inner code implements controlled-Hadamard operations, and the number of physical qubits or qudits used is odd.

16. The circuit of claim 15, wherein: (a) the inner code uses 17 physical qubits, obtains 1 logical qubit, and has a code distance of 5; or (b) the inner code uses 21 physical qubits, obtains 3 logical qubits, and has a code distance of 5.

17. The circuit of claim 9, wherein the outer code is configured to give seventh order reduction in error when used with an inner code of distance 7 or more, and where the outer code is obtained from a Tanner graph of girth 6 or more and the outer code has distance 7 or more.

18. A method for distilling magic states in a topologically protected quantum computing device that uses Majorana zero modes to implement physical qubits or qudits, comprising:

in the topologically protected quantum computing device that uses Majorana zero modes to implement the physical qubits or the qudits:
applying an inner code and couter code to distill a plurality of the magic states in the quantum computing device, and thereby possible error in the magic states,
wherein the inner code comprises Bose-Chaudhuri-Hocquenghem ("BCH") codes to implement operations on a plurality of the physical qubits or qudits in the quantum computing device, and
wherein error correction is implemented on the inner code.

19. The method of claim 18, wherein the outer codes are determined by arranging the qubits or qudits in a two dimensional or three dimensional grid.

20. A circuit configured to distill magic states in a quantum computing device, comprising:
quantum circuit elements configured to implement an inner code and an outer code,
wherein the inner code provides a weakly self-dual error correcting code to implement control-Swap operations on a plurality of logical qubits or qudits,
wherein the outer code provides an error-correcting code,
wherein the inner code and the outer code are concatenated with one or more stabilizer codes, and
wherein the circuit is part of a topologically protected quantum computer using Majorana zero modes to implement the plurality of logical qubits or qudits.

21. The circuit of claim 20, wherein the one or more stabilizer codes are different from the inner code and the outer code.

22. The circuit of claim 20, wherein the concatenation results in magic states being input at different circuit stages of the circuit.

23. The circuit of claim 20, wherein the inner code provides error suppression to a target power.

24. The circuit of claim 23, wherein the outer code provides the error-correcting code with a sensitivity selected to test the properties of the magic states such that measurement errors are also suppressed by the target power.

* * * * *